(12) United States Patent
Takafuji et al.

(10) Patent No.: US 7,244,990 B2
(45) Date of Patent: Jul. 17, 2007

(54) SEMICONDUCTOR DEVICE

(75) Inventors: Yutaka Takafuji, Nara (JP); Takashi Itoga, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/802,735

(22) Filed: Mar. 18, 2004

(65) Prior Publication Data

US 2004/0183133 A1 Sep. 23, 2004

(30) Foreign Application Priority Data

Mar. 20, 2003 (JP) ............................. 2003-077283

(51) Int. Cl.
*H01L 27/01* (2006.01)
*H01L 27/12* (2006.01)
*H01L 31/0392* (2006.01)

(52) U.S. Cl. .................. 257/347; 257/351; 257/352; 257/353; 257/507

(58) Field of Classification Search .............. 257/69, 257/347–354, 59, 64, 66, 70, 72, 507
See application file for complete search history.

(56) References Cited

U.S. PATENT DOCUMENTS

| 6,232,142 B1 * | 5/2001 | Yasukawa ................. 438/69 |
| 6,750,476 B2 * | 6/2004 | Katayama .................. 257/59 |
| 2005/0231657 A1 * | 10/2005 | Zhang et al. .............. 349/42 |

FOREIGN PATENT DOCUMENTS

| EP | 0 559 389 | * | 9/1993 |
| JP | 06-11729 | * | 1/1994 |
| JP | 7-235651 A | | 9/1995 |
| JP | 8-262474 A | | 10/1996 |
| JP | 2001-255559 | * | 9/2001 |
| WO | 93/15589 A1 | | 8/1993 |

OTHER PUBLICATIONS

Salerno et al, "Single Crystal Silicon AMLCDs", Conference Record of the 1994 International Display Research Conference (IDRC) (1994), pp. 39-44.

Tong et al, "Semiconductor Wafer Bonding: Science and Technology", John Wiley & Sons, Inc., New York, 1999, pp. 8-11, 48-55, 58-65, 108 and 109.

(Continued)

*Primary Examiner*—Thien F Tran
(74) *Attorney, Agent, or Firm*—Nixon & Vanderhye, PC

(57) ABSTRACT

On an SOI substrate, a hydrogen ion implantation section in which distribution of hydrogen ions peaks in a BOX layer (buried oxide film layer), and a single-crystal silicon thin-film transistor are formed. Then this SOI substrate is bonded with an insulating substrate. Subsequently, the SOI substrate is cleaved at the hydrogen ion implantation section by carrying out heat treatment, so that an unnecessary part of the SOI substrate is removed, Furthermore, the BOX layer remaining on the single-crystal silicon thin-film transistor is removed by etching. With this, it is possible to from a single-crystal silicon thin-film device on an insulating substrate, without using an adhesive. Moreover, it is possible to provide a semiconductor device which has no surface damage and includes a single-crystal silicon thin film which is thin and uniform in thickness.

23 Claims, 11 Drawing Sheets

OTHER PUBLICATIONS

Warner et al, "Low-Temperature Oxide-Bonded Three-Dimensional Integrated Circuits", 2002 IEEE International SOI Conference, Oct. 2002, pp. 123-125.

Allen et al, "SOI Uniformity and Surface Smoothness Improvement Using GCIB Processing", 2002 IEEE International SOI Conference, Oct. 2002, pp. 192-193.

Matsumoto et al, "70 nm SOI-CMOS of 135 GHZ $f_{max}$ with Dual Offset-Implanted Source-Drain Extension Structure for RF/Analog and Logic Applications", International Electron Device Meeting, Dec. 2001, pp. 219-222.

Vandooren et al, "Scaling Assessment of Fully-Depleted SOI Technology at the 30nm Gate Length Generation", 2002 IEEE international SOI Conference Proceedings, Oct. 2002, pp. 25-27.

* cited by examiner

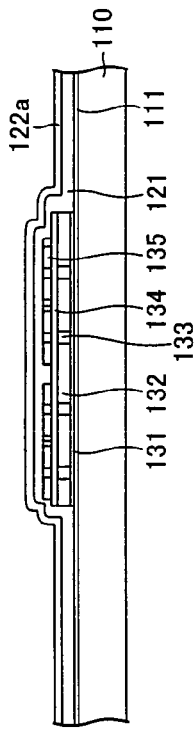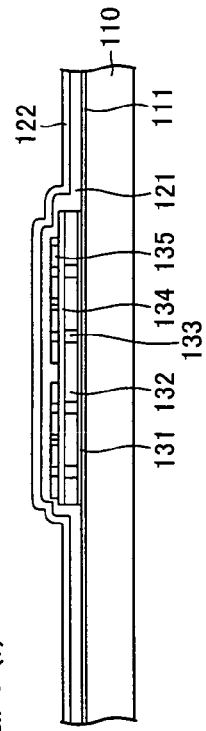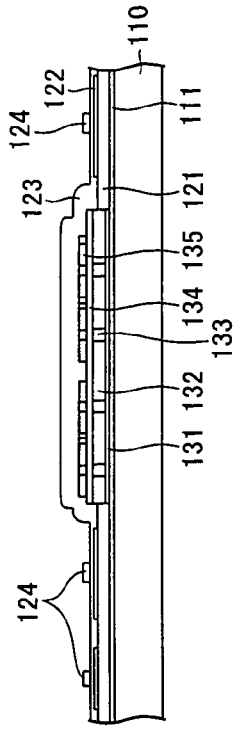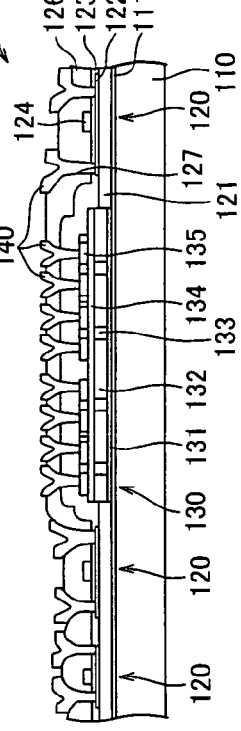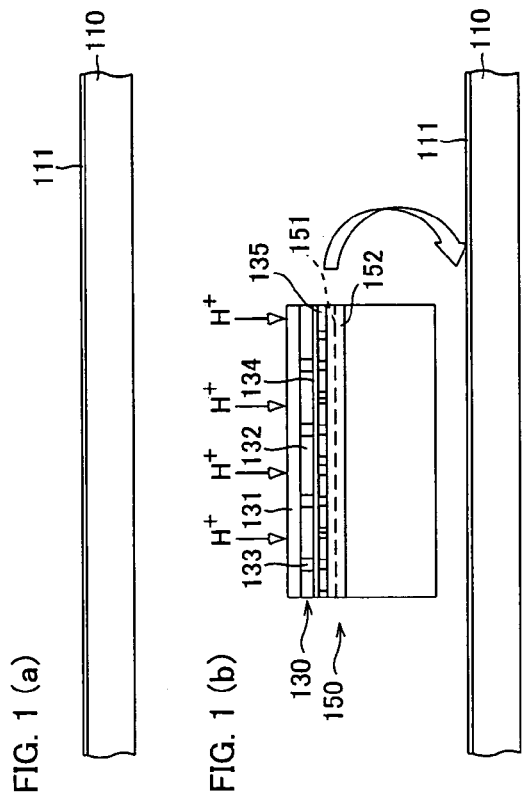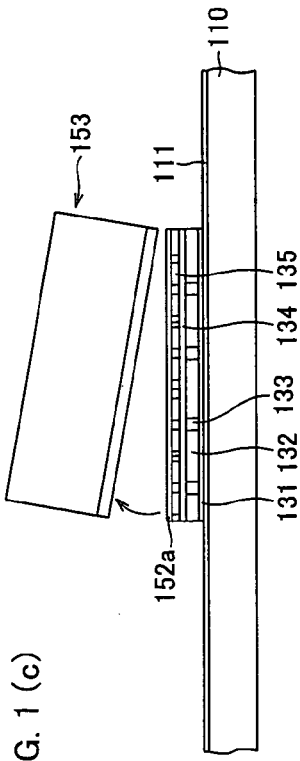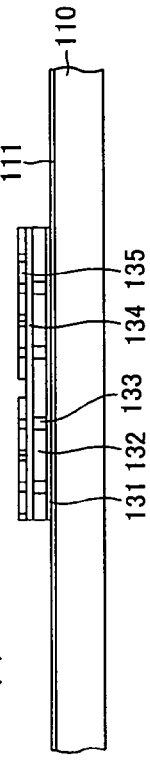

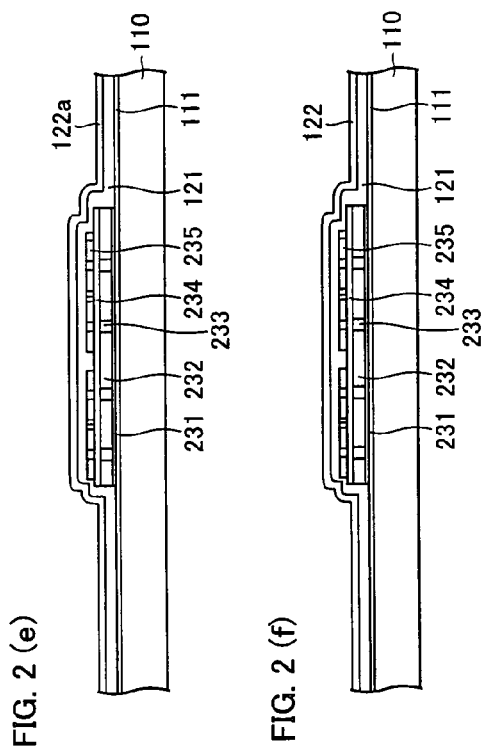
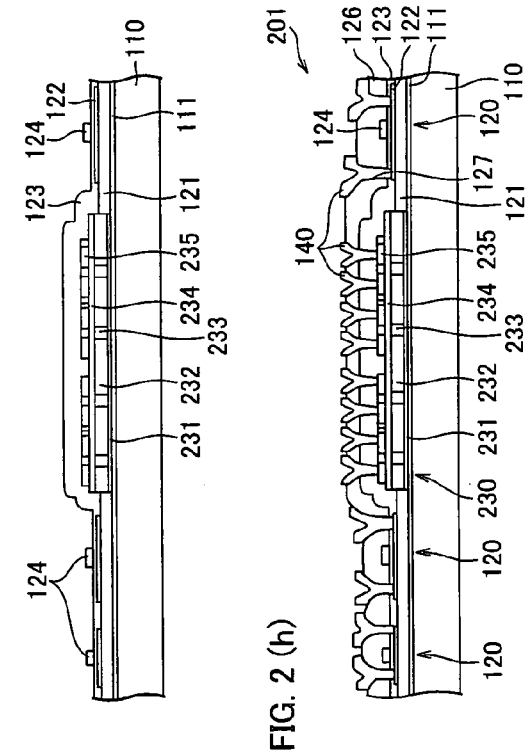
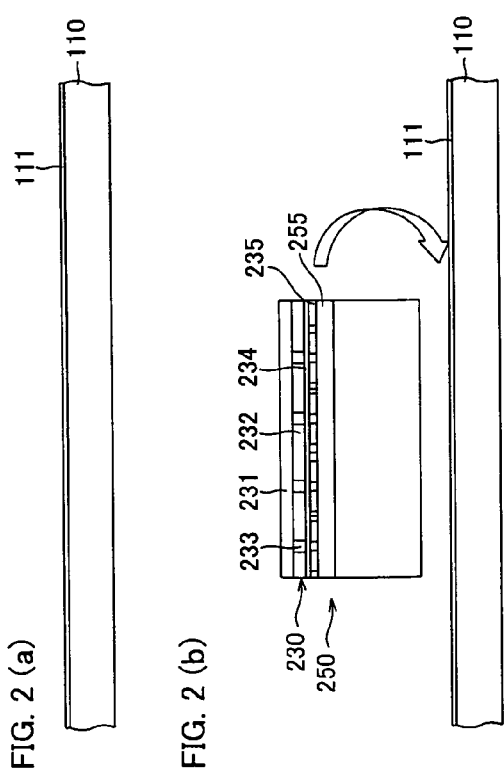
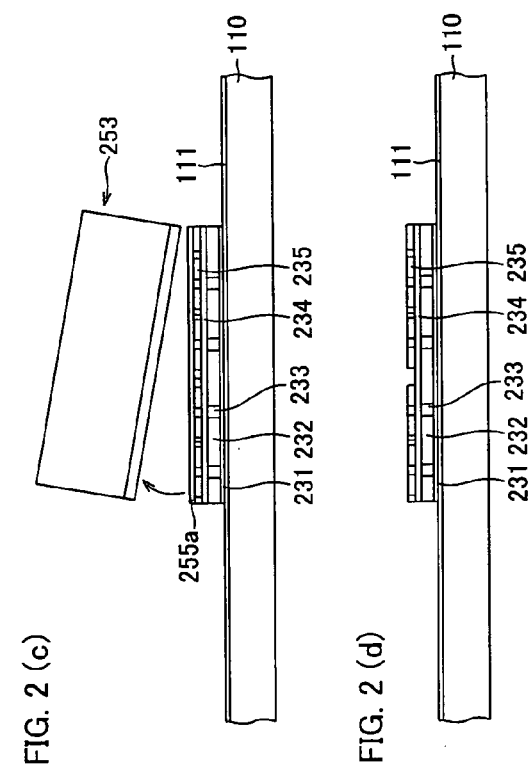

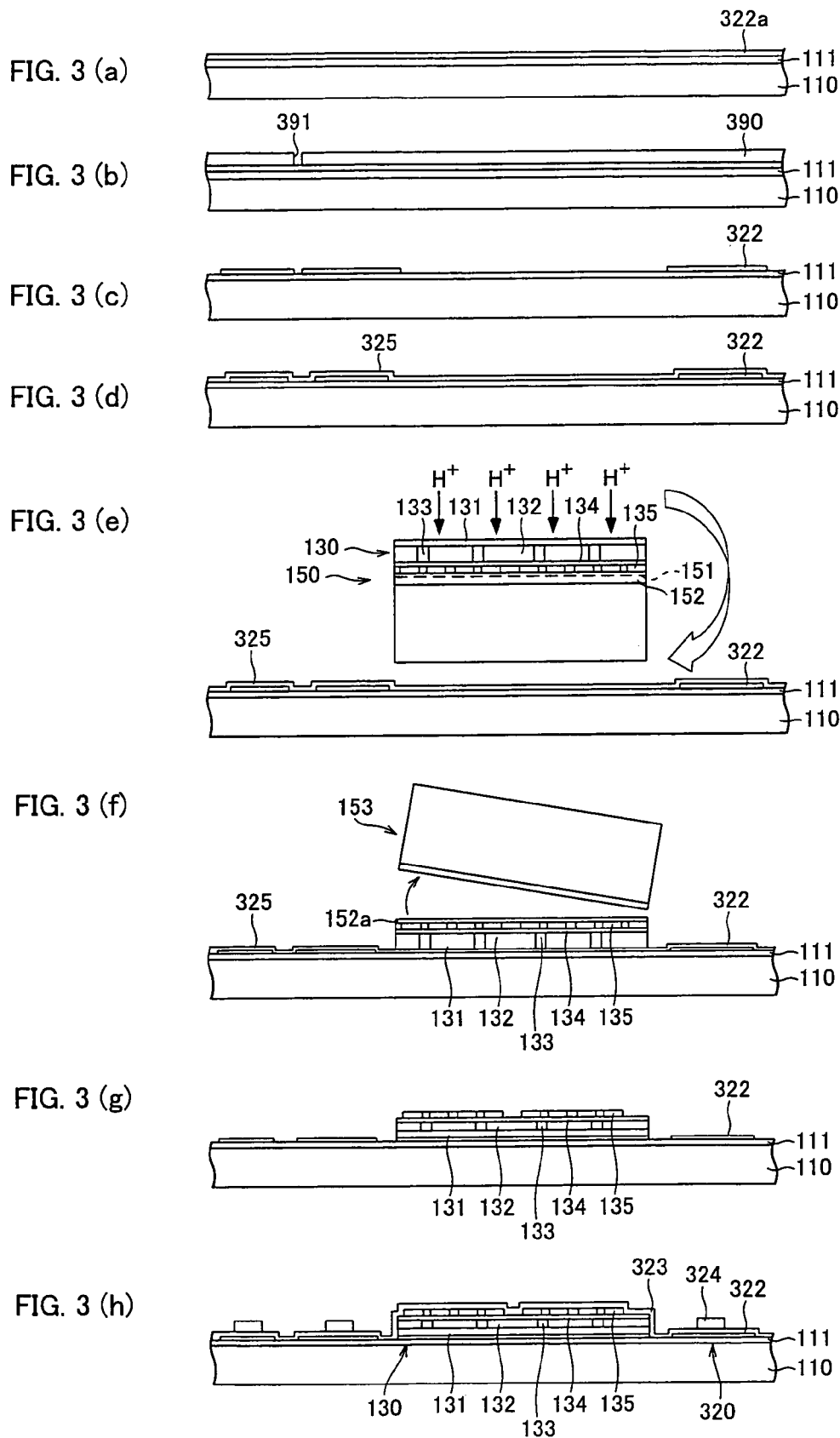

SEMICONDUCTOR DEVICE

This Nonprovisional application claims priority under 35 U.S.C. § 119(a) on patent application Ser. No. 2003-077283 filed in Japan on Mar. 20, 2003, the entire contents of which are hereby incorporated by reference.

FIELD OF THE INVENTION

The present invention relates to SOI technology, and particularly relates to a semiconductor device utilized for a high-performance integrated circuit formed on a low-priced general-purpose insulating substrate and a TFT-driven active matrix LCD, OLED and the like.

BACKGROUND OF THE INVENTION

There have been so-called active matrix driving devices which drive, for instance, liquid crystal display panels and organic EL display panels and are constructed in such a manner that a thin-film transistor (TFT) made of amorphous silicon (amorphous Si; a-Si) or polycrystalline silicon (p-Si) is formed on a glass substrate. In connection with this, researches have been made on silicon devices with higher performance, aiming for integrating systems such as a peripheral driver, high-performance memory, microprocessor, image processor, and timing controller.

In recent years, peripheral drivers which are integrated using polycrystalline silicon having high mobility and operating at high speed have come into use. However, polycrystalline silicon has a localized state in the gap, which is caused due to reasons such as incomplete crystallinity and the defects around the crystal grain boundary, so that the mobility decreases and S-coefficient (subthreshold coefficient) increases. For this reason, the performance of a transistor made of polycrystalline silicon is insufficient to form a high-performance device required for integrating systems such as a high-performance peripheral driver, memory, microprocessor, image processor, and timing controller.

To form a high-performance device on an active matrix driving device, researches have been made on a technology to form a semiconductor device in such a way that a device made of single-crystal silicon thin film, such as a thin-film transistor, is formed in advance, and then this device is adhered on an insulating substrate (e.g. International Publication No. WO93/15589 and J. P. Salerno, Single Crystal silicon AMLCDs, Conference Record of the 1994 International Display Research Conference(IDRC) p.39-44(1994)).

For instance, the above-mentioned Japanese National Publication discloses such an example that a semiconductor device, which is manufactured by transferring a single-crystal silicon thin-film transistor which has been made in advance onto an insulating substrate onto a glass substrate using an adhesive, is utilized for a display panel of an active matrix liquid crystal display device.

Also, as an example of a method of manufacturing an SOI (Silicon On Insulator) wafer, Japanese Laid-Open Patent Application No. 7-235651/1995 (published on Sep. 5, 1995) discloses such a method that an epitaxial silicon layer is grown on porous Si, the epitaxial silicon layer is bonded with a handle wafer, and then separated from the porous silicon layer (Q. Y. Tong & U. Gesele, SEMICONDUCTOR WAFER BONDING: SCIENCE AND TECHNOLOGY, John Wiley & Sons, New York (1999)).

In the meantime, researches have also been made in the field of integrated circuits on an SOI technology to separate a thin single-crystal silicon layer at an oxidized film, in order to further causing a bulk silicon device to speed-up and consume lower amount of power. Concerning this, there is a technique for forming an SOI wafer, arranged such that a silicon or quartz handle wafer with an oxidized film thereon is bonded with single-crystal silicon, and then thinning these members so as to form an SOI (e.g. Japanese Laid-Open Patent Application No. 5-211128/1993 (published on Aug. 20, 1993). Furthermore, also for such devices, a technology for reducing the size of a transistor for the sake of improving performance and increasing the number of components per chip has been grown as in the case of bulk silicon devices (e.g. T. Matsumoto et al., International Electron Devices Meeting: Dec, pp.219-222 (2001)).

However, according to the conventional semiconductor devices and manufacturing methods thereof, there is a problem in heat resistance because a high-performance device formed from a single-crystal silicon thin film is adhered with a glass substrate using an adhesive. Due to this problem, there are limitations in the manufacturing process and device structure: For instance, it is impossible to form members such as a high-quality inorganic insulating film and TFT after carrying out adhering using an adhesive.

To solve this problem, a method of obtaining a silicon thin film by bonding a silicon wafer, to which hydrogen ions are implanted, with a crystallized glass substrate is disclosed by, for instance, Japanese Laid-Open Patent Application No. 8-262474/1996 (published on Oct. 11, 1996). However, this method adopts, as a substrate, a crystallized glass including atoms of alkali, thereby being expensive and inferior in workability. Furthermore, according to the method, the glass substrate has to be made from a 8-inch or 12-inch (Si) wafer, and hence it is not possible to adopt the method for a large-sized glass substrate (at least 300 mm×400 mm in size). On this account, from a cost/size point of view, it is very difficult to adopt the method disclosed by the above-mentioned publication to display devices.

On the other hand, active matrix substrates utilized for OLEDs (Organic Light Emitting Diodes) and liquid crystal display devices require most-advanced micro-fabrication technology to form parts (e.g. MPU) which have to be high-performance and highly-integrated. However, in the light of productivity, such active matrix substrates are still mainly made by forming a polycrystalline silicon on a large-sized glass substrate, so that the micro-fabrication necessary for obtaining high-performance and high-integration cannot sufficiently carried out. This is because of the problems such as the following: In consideration of the swell, irregularity in thickness, expansion and contraction (especially contraction), and the size of an exposure region, it is difficult to increase the reduction ratio of reduced projection exposure. Furthermore, the micro-fabrication is also limited by device characteristics, for instance, the fluctuation of the crystal grain boundary with respect to a transistor channel section is increased.

For the reasons above, it is extremely difficult to realize a device requiring high-performance and high-integration, such as an MPU, by adopting an arrangement of forming a polycrystalline silicon on a large-sized glass substrate.

As in the case of bulk silicon devices, SOI devices in the field of integrated circuits also require most-advanced micro-fabrication technology to form parts (e.g. MPU) which have to be high-performance and highly-integrated. Furthermore, to increase the number of components per chip, reduce power consumption (driving voltage), and improve working speed, it is necessary to miniaturize a transistor. To realize this, one has to take countermeasures against the decrease of a threshold voltage due to DIBL (Drain induced Barrier Lowering) and increase of S-value which is a short channel effect that is intensified as the miniaturization advances, and decrease of field effect due to quantum effect.

To restrain the short channel effect, it is considered that the reduction of the thickness of a silicon film is essential. For instance, according to A. Vandooren et al., "2002 IEEE international SOI Conference Proceedings", a desirable thickness is about not more than 15-20 nm in the case of a MOS transistor having an SOI structure in which the gate length is not more than 0.1 micrometer.

To improve the characteristics of the transistor, meanwhile, it is necessary to reduce the thickness of a single-crystal silicon thin film and remove a damaged layer on the surface while keeping the thickness of the silicon thin film to be uniform. That is to say, a layer damaged due to reasons such as dangling bond and crystal defect, the layer being harmful in terms of electric properties, has to be removed without causing the fluctuation in the transistor characteristics, which is caused due to irregular thickness of the silicon thin film.

However, when only a part of the surface of an insulating film (e.g. $SiO_2$ film) is covered with a single-crystal silicon thin film, it is impossible to use methods such as CMP. For this reason, when a single-crystal silicon thin-film device is formed only in a part of the surface of an insulating film, it has been extremely difficult to remove the damaged layer on the surface of the silicon thin film.

SUMMARY OF THE INVENTION

The present invention has been done to solve the problem identified above, and thus intends to provide a semiconductor device and a method of manufacturing the same; this semiconductor device includes (i) a single-crystal silicon thin-film device which is easily formed on an insulating substrate without using an adhesive and (ii) a thin single-crystal silicon thin film which is uniform in thickness and with no surface damage.

To achieve the above-mentioned objective, the semiconductor device of the present invention, comprises: an insulating substrate having a surface on which an $SiO_2$ film is formed; and a single-crystal silicon substrate bonded with the insulating substrate, and is arranged in such a manner that, after bonding a surface of the single-crystal silicon substrate including a single-crystal silicon thin film, on the surface of the single-crystal silicon substrate an $SiO_2$ film being formed, with the surface of the insulating substrate, where the $SiO_2$ film is formed, a part of the single-crystal silicon substrate is separated, and then a part of a remaining part of the single-crystal silicon substrate, the remaining part still being on the insulating substrate after the part is separated, is removed.

To achieve the abovementioned objective, the method of manufacturing the semiconductor device of the present invention, in which a single-crystal silicon substrate is bonded with an insulating substrate having a surface on which an $SiO_2$ film is formed, comprises the steps of: (i) bonding a surface of the single-crystal silicon substrate including a single-crystal silicon thin film, on the surface of the single-crystal silicon substrate an $SiO_2$ film being formed, with the surface of the insulating substrate, where the SiO2 film is formed; (ii) after the step (i), separating a part of the single-crystal silicon substrate; and (iii) removing a part of a remaining part of the single-crystal silicon substrate, the remaining part still being on the insulating substrate after the step (ii).

For instance, the semiconductor device of the present invention may comprise: an insulating substrate; and a single-crystal silicon substrate bonded with the insulating substrate, and is arranged in such a manner that, the single-crystal silicon substrate includes a BOX (Buried Oxide) layer, a hydrogen ion implantation section in which distribution of hydrogen ions peaks in the BOX layer, and a single-crystal silicon thin film formed on the BOX layer, the insulating substrate is bonded with a surface of the single-crystal silicon substrate, the surface being on a single-crystal silicon thin film side with respect to the BOX layer, and a part of the single-crystal silicon substrate is separated at the hydrogen ion implantation section, and the BOX layer is removed from a remaining part of the single-crystal silicon substrate, the remaining part still being on the insulating substrate after the part is separated.

The method of manufacturing the semiconductor device of the present invention, in which a single-crystal silicon substrate is bonded with an insulating substrate having a surface on which an $SiO_2$ film is formed, may comprise the steps of: (I) bonding the surface of the insulating substrate, where the $SiO_2$ film is formed, with a surface of the single-crystal silicon substrate including a BOX layer, a hydrogen ion implantation section in which distribution of hydrogen ions peaks in the BOX layer, and the single-crystal silicon thin film formed on the BOX layer, the surface of the single-crystal silicon substrate being on a single-crystal silicon thin film side with respect to the BOX layer and having an $SiO_2$ film formed thereon; (II) after the step (I), separating a part of the single-crystal silicon substrate at the hydrogen ion implantation section; and (III) removing the BOX layer from a remaining part of the single-crystal silicon substrate, the remaining part still being on the insulating substrate after the step (II).

With the above-mentioned semiconductor device and the method of manufacturing the same, before bonding the single-crystal silicon substrate with the insulating substrate, the BOX layer, the hydrogen ion implantation section in which distribution of hydrogen ions peaks in the BOX layer, and the single-crystal silicon thin film formed on the BOX layer are formed on the single-crystal silicon substrate. This makes it possible to easily reduce the thickness of the single-crystal silicon thin film.

Furthermore, since the separation at the hydrogen ion implantation section formed in the BOX layer of the single-crystal silicon substrate is carried out after bonding the insulating substrate with the single-crystal silicon substrate, a damaged layer on the cleaved surface, which has a dangling bond and point defect, is confined only in the BOX layer.

Thus, after the separation, the BOX layer on the separation surface is removed from that part of the single-crystal silicon substrate which still remains on the insulating substrate, so that the single-crystal silicon substrate with no surface damages can be formed on the insulating substrate, without deteriorating uniformity of the thickness of the film. With this, it is, for instance, possible to restrain the variation of a threshold voltage of a MOS SOI transistor.

Thus, the arrangement above realizes a single-crystal silicon thin film which is thin, has no surface damages, and uniform in thickness, and by which a single-crystal silicon thin-film device can be easily formed without using an adhesive.

Note that, the single-crystal silicon thin-film device is a device formed from a single-crystal silicon thin film, such as a MOS transistor, bipolar transistor, SIT, and diode.

The semiconductor device of the present invention may comprise: an insulating substrate having a surface on which an $SiO_2$ film is formed; and a single-crystal silicon substrate bonded with the insulating substrate, and is arranged in such a manner that, the single-crystal silicon substrate includes a porous silicon layer and a single-crystal silicon thin film formed on the porous silicon layer and has a surface which is on a single-crystal silicon thin film side with respect to the porous silicon layer and on which an $SiO_2$ film is formed, the surface of the insulating substrate, where the $SiO_2$ film is formed, is bonded with the surface of the single-crystal silicon substrate, where the $SiO_2$ film is formed, and a part of the single-crystal silicon substrate is separated at the porous silicon layer, and the porous silicon layer is removed from a remaining part of the single-crystal silicon substrate, the remaining part still being on the insulating substrate after the part is separated.

The method of manufacturing the semiconductor device of the present invention, in which a single-crystal silicon substrate is bonded with an insulating substrate having a surface on which an $SiO_2$ film is formed, may comprise the steps of: (i) bonding the surface of the insulating substrate, on which the $SiO_2$ film is formed, with a surface of the single-crystal silicon thin film which is covered with a surface of the single-crystal silicon substrate including a single-crystal silicon thin film formed on a porous silicon layer, the surface of the single-crystal silicon substrate being on a single-crystal silicon thin film side with respect to the porous silicon layer and having an $SiO_2$ film formed thereon; (ii) after the step (i), separating a part of the single-crystal silicon substrate at the porous silicon layer; and (iii) removing the porous silicon layer from a remaining part of the single-crystal silicon substrate, the remaining part still being on the insulating substrate after the step (ii).

According to the above-described semiconductor device and the method of manufacturing the same, the porous silicon layer and the single-crystal silicon thin film on the porous silicon layer are formed before bonding the single-crystal silicon substrate with the insulating substrate. This makes it possible to easily reduce the thickness of the single-crystal silicon thin film.

Furthermore, since the separation at the porous silicon layer of the single-crystal silicon substrate is carried out after bonding the insulating substrate with the single-crystal silicon substrate, and no hydrogen in is implanted, a damaged layer on the separation surface, which has a dangling bond and crystal defect, is confined only in the porous silicon layer.

Thus, after the separation, the porous silicon layer on the separation surface is removed from that part of the single-crystal silicon substrate which still remains on the insulating substrate, so that the single-crystal silicon thin film with no surface damages can be formed on the insulating substrate, without deteriorating uniformity of the thickness of the film.

Thus, the arrangement above realizes a single-crystal silicon thin film which is thin, has no surface damages, and uniform in thickness, and by which a single-crystal silicon thin-film device can be easily formed without using an adhesive.

Furthermore, according to the arrangement above, the number of defects in single-crystal silicon is very small. On this account, the mobility of the single-crystal silicon thin-film transistor formed using the porous silicon layer is higher than the mobility of the single-crystal silicon thin-film transistor formed using the single-crystal silicon substrate with the hydrogen ion implantation section.

For a fuller understanding of the nature and advantages of the invention, reference should be made to the ensuing detailed description taken in conjunction with the accompanying drawings.

BRIEF DESCRIPTION OF THE DRAWINGS

FIGS. 1(a) through 1(h) are cross sections illustrating manufacturing processes in accordance with an embodiment of the present invention.

FIGS. 2(a) through 2(h) are cross sections illustrating manufacturing processes in accordance with another embodiment of the present invention.

FIGS. 3(a) through 3(h) are cross sections illustrating manufacturing processes in accordance with a further embodiment of the present invention.

DESCRIPTION OF THE EMBODIMENTS

First Embodiment

The following will describe an embodiment of a semiconductor device of the present invention and a method of manufacturing the same.

Figure 7:
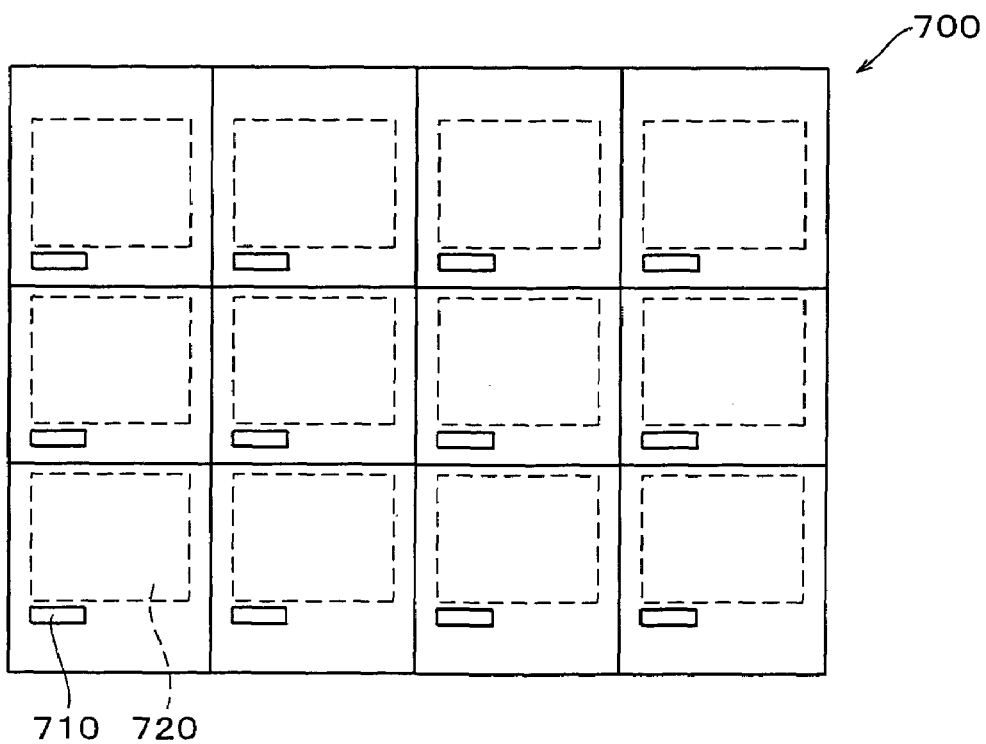
FIG. 7 is a plan view showing an active matrix substrate manufactured using a semiconductor device of the present invention.

A semiconductor device 101 of the present embodiment is arranged in such a manner that a polycrystalline silicon thin-film transistor (non-single-crystal silicon thin-film transistor; non-single-crystal silicon thin-film device) 120 and a MOS (Metal Oxide Semiconductor) single-crystal silicon thin-film transistor (single-crystal silicon thin-film device) 130 are integrated on different regions on an insulating substrate. As FIG. 7 shows, the semiconductor device 101 can be further integrated, as a driving circuit 710, on an active matrix substrate 700 having a display section 720.

Figure 8:
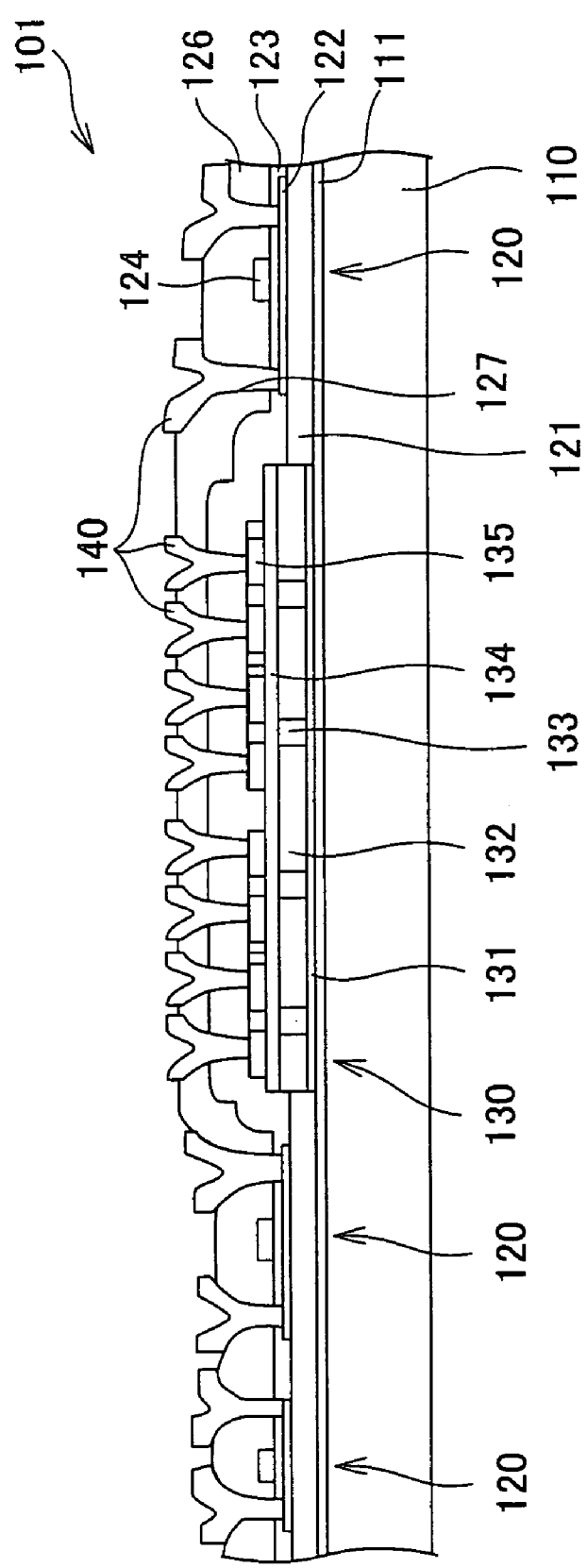
FIG. 8 is an enlarged view of FIG. 1(h).

As illustrated in FIG. 8, the semiconductor device 101 is arranged so that, on an insulating substrate 110, an $SiO_2$ (oxidized silicon) film (oxidized film) 111, the MOS polycrystalline silicon thin-film transistor 120 including a polycrystalline silicon thin-film 122, the MOS single-crystal silicon thin-film transistor 130 including the single-crystal silicon thin film 135, and metal interconnects 140 are provided. The $SiO_2$ film 111 in this case has a thickness of about 100 nm and covers the entire surface of the insulating substrate 110.

The MOS polycrystalline silicon thin-film transistor 120 including the polycrystalline silicon thin-film 122 is formed on an interlayer insulating film ($SiO_2$ film) 121 which is formed on the $SiO_2$ film 111. This polycrystalline silicon thin-film transistor 120 is made up of the polycrystalline silicon thin-film 122, a gate insulating film (gate oxidized film, $SiO_2$ film) 123, and gate electrodes 124 which are formed in this order and on the interlayer insulating film 121. The polycrystalline silicon thin-film 122 is island-shaped, about 50 nm thick, and formed on the interlayer insulating film 121. The gate insulating film 123 is about 60 nm thick and covers the entire surface of the polycrystalline silicon thin film 122.

On the other hand, the MOS single-crystal silicon thin-film transistor 130 including the single-crystal silicon thin film 135 is formed in a region on the $SiO_2$ film 111, the region being different from the region where the polycrystalline silicon thin-film transistor 120 is formed. The single-crystal silicon thin-film transistor 130 is arranged in the following manner: On the $SiO_2$ film 111, an $SiO_2$ film 131 which is about 10 nm thick, a planarization film (BPSG; boro-phospho-silicate glass) 132, gate electrodes 133, a gate insulating film 134 which is about 15 nm thick, and a single-crystal silicon thin film 135 which is about 20 nm thick and island-shaped are formed in this order.

On the polycrystalline silicon thin-film transistor 120 and single-crystal silicon thin-film transistor 130, i.e. above the entire surface of the insulating substrate 110, an interlayer insulating ($SiO_2$ film) 126 is formed. Note that, this interlayer insulating ($SiO_2$ film) 126 has openings (contact holes 127), and in these contact holes 127, metal interconnects 140 made of metal such as Al—Si alloy are formed, respectively. These metal interconnects 140 contact the island-shaped regions in the polycrystalline silicon thin film 122 and the single-crystal silicon thin film 135 from above.

Now, a method of manufacturing the semiconductor device 101 will be described in reference to FIGS. 1(a)-1(h).

First, as in FIG. 1(a), the $SiO_2$ film 111 which is about 50 nm thick is deposited so as to cover the entire surface of the insulating substrate 110, by plasma CVD (Chemical Vapor Deposition) using a mixed gas of TEOS (Tetra Ethyl Ortho Silicate; $Si(OC_2H_5)_4$) and $O_2$. This $SiO_2$ film 111 is formed in order to facilitate the below-mentioned bonding of the insulating substrate 110 and SOI substrate 150.

Note that, as the insulating substrate 110, Code 1737 (alkaline-earth alumino-borosilicate glass) of Corning®, which is a high strain point glass is adopted.

Next, as shown in FIG. 1(b), an SOI substrate (single-crystal silicon substrate) 150 on which the single-crystal silicon thin-film transistor 130 has independently been formed is bonded with the insulating substrate 110.

The following shows how the SOI substrate 150 is formed (cf. FIG. 1(b)). First, a part of a CMOS process is carried out on a BOX layer 152 by a typical IC production line, in other words, on the BOX layer 152, the following members are formed: the single-crystal silicon thin film 135 to which source and drain impurity ions ($BF_2^+$ and $P^{30}$) are implanted and whose P-type and N-type channel regions are channel-implanted; the gate insulating film 134, gate electrodes 133, protective insulating film (illustrated as a part of the planarization film 132), and planarization film (interlayer planarization film) 132. Note that, the planarization film 132 is formed in such a manner that, after depositing $SiO_2$ and BPSG by a method such as CVD, the BPSG is melted, $SiO_2$ is further deposited by methods such as CVD and plasma CVD using TEOS, etc., and then planarization is carried out by CMP. Alternatively, the planarization film 132 may be formed by one of the following two ways: After depositing $SiO_2$ by a method such as CVD, the $SiO_2$ is etched by RIE so that only concave regions (regions without gate patterns) of the substrate remain, $SiO_2$ is further deposited thereon by methods such as CVD and plasma CVD using TEOS, etc., and then planarization is carried out by CMP; or, after depositing $SiO_2$ by a method such as CVD and plasma CVD using TEOS, etc., the $SiO_2$ is etched by RIE so that only concave regions (areas without gate patterns) of the substrate remain, $SiO_2$ is further deposited thereon by methods such as CVD and plasma CVD using TEOS, etc., and then planarization is carried out by CMP.

Subsequently, on the single-crystal silicon thin film 135, the $SiO_2$ film 131 which is about 10 nm thick is formed. This $SiO_2$ film 131 is formed in order to facilitate the below-mentioned bonding of the insulating substrate 110 and SOI substrate 150.

Subsequently, hydrogen ions are implanted in the BOX layer 152 at a dose of $5 \times 10^{16}/cm^2$ so that the distribution of the hydrogen ions peaks in the BOX layer 152. As a result, the SOI substrate 150 is formed.

Note that, the gate length of the gate electrodes 133 in the semiconductor device 101 is 0.25 μm.

The gate electrodes 133 are in this case made of a heavily-doped polycrystalline silicon film and W silicide. However, the gate electrodes 133 may be made solely of polycrystalline silicon or made of other high melting point metals and silicide. The material of the gate electrodes 133 is determined in consideration of electric resistance and heat resistance.

Next, the SOI substrate 150 formed as above is cut so as to have a predetermined size in conformity to a bonding region on the insulating substrate 110.

Then the insulating substrate 110 and the SOI substrate 150 having been cut are cleaned and activated by carrying out RCA (SC-1) clean. Furthermore, that surface of the SOI substrate 150 which is on the $SiO_2$ film 131 side is aligned with a predetermined region on the insulating substrate 110, and the surface and the predetermined region are caused to closely contact each other so as to be bonded with each other at room temperatures. It is noted that, in this process, an alignment mark on the SOI substrate 150 is detected from the glass substrate (insulating substrate 110) side, and is aligned with the alignment mark formed on the surface of the glass substrate. This makes it possible to carry out the alignment far more precisely than the bonding of silicon substrates. In the present case, for instance, the alignment with an accuracy of ±1 μm is achieved.

Subsequently, as shown in FIG. 1(c), an unnecessary part 153 of the SOI substrate 150 bonded with the insulating substrate 110 is subjected to cleavage at a hydrogen ion implantation section 151 as a border, by heat-treating the hydrogen ion implantation section 151. That is to say, the hydrogen ion implantation section 151 of the SOI substrate 150 is heated so that a temperature thereof is increased to be not less than the temperature of hydrogen dissociation from silicon, and consequently the cleavage occurs at a hydrogen ion implantation section 151 as a border. Note that, the temperature of the hydrogen ion implantation section 151 to be not less than the temperature of hydrogen dissociation from silicon is within the range of 400-600° C., and in the present case the heat treatment is carried out at about 550° C.

Then the single-crystal silicon thin film 135 and an unnecessary part of the BOX layer (i.e. BOX layer 152a), which still remain on the insulating substrate 110 after the cleavage, are wet-etched using dilute hydrofluoric acid, so that the surface damage is removed (cf. FIG. 1(c)). Subsequently, the single-crystal silicon thin film 135 is caused to be island-shaped, and consequently, as shown in FIG. 1(e), a part of a MOS TFT, the part being the single-crystal silicon thin film 135 about 20 nm thick, is formed on the insulating substrate 110.

As FIG. 1(e) shows, above the entire surface of the insulating substrate 110, the $SiO_2$ film 121 which is about 100 nm thick is deposited by plasma CVD using a mixed gas of $SiH_4$ and $N_2O$. Further, on the entire surface thereof, an amorphous silicon film 122a which is about 50 nm thick is formed by plasma CVD using $SiH_4$ gas.

Moreover, an excimer laser is applied to the amorphous silicon film 122a, so that the heated amorphous silicon film 122a is crystallized. As a result, a polycrystalline silicon layer is grown so that the polycrystalline silicon thin-film 122 is formed (cf. FIG. 1(f)). This application of the excimer laser also improves the bonding strength between the $SiO_2$ film 131 on the single-crystal silicon thin film 135 and the $SiO_2$ film 111 on the insulating substrate 110. Note that, on the occasion of growing polycrystalline silicon using a laser, problems that the junction is broken due to redistribution of doped impurities, etc. may occur, when the energy of the laser is too high. To avoid this occurs, for instance, it is necessary to either precisely control the power of the laser or cause the laser not to irradiate the single-crystal region.

Next, as FIG. 1(g) shows, to remove regions other than a region to be an active region of the device, an unnecessary part of the polycrystalline silicon thin film 122 and at least a part of the $SiO_2$ film 121, the part being on the single-crystal silicon thin film 135, are removed by etching. Furthermore, an unnecessary part of the polycrystalline silicon thin film 122 is removed by etching so that the remaining polycrystalline silicon thin film 122 is island-shaped in conformity to a predetermined shape of the device.

Then an $SiO_2$ film (not illustrated) which is about 350 nm thick is deposited by plasma CVD using TEOS-ozone mixed gas, and then about 400 nm etchback is carried out by RIE (Reactive Ion Etching) which is a type of anisotropic etching. Subsequently, by plasma CVD using a mixed gas of $SiH_4$ and $N_2O$, the gate insulating film ($SiO_2$ film) 123 of the polycrystalline silicon thin-film transistor 120, which is about 60 nm thick, is formed, and on this gate insulating film 123, the gate electrodes 124 are formed.

As shown in FIG. 1(h), the following operations are identical with those of a known polysilicon TFT forming process. That is, impurity ions ($N^{30}$ and $P^{30}$) are implanted into the polycrystalline silicon thin film 122. Then by plasma CVD using a mixed gas of TEOS and $O_2$, the interlayer insulating film (interlayer planarization insulating film; $SiO_2$ film) 126 which is about 350 nm thick is deposited. Subsequently, the contact holes 127 are perforated and the metal interconnects 140 are formed therein.

The gate electrodes 124 in this case are made of polycrystalline silicon and W silicide. However, the gate electrodes 124 may be made of materials such as polycrystalline Si, other types of silicide, and polycide.

The diameter of the contact hole 127 and the width of the metal interconnects 140 are both determined as 2 µm, taking into consideration of the precision of photolithography on a large-sized glass substrate and an alignment precision on the occasion of the bonding.

As described above, the semiconductor device 101 is formed in the following manner: Hydrogen ions are implanted, into the SOI substrate 150 including the single-crystal silicon thin-film transistor 130, and the SOI substrate 150 is bonded with the insulating substrate 110. Subsequently, heat treatment is carried out so that the unnecessary part 153 of the SOI substrate 150 is cleaved at the hydrogen ion implantation section as a border. Thus, no adhesive is used in the process of bonding the single-crystal silicon thin-film transistor 130 with the insulating substrate 110.

For this reason, the bonding region excels in heat resistance, so that a high-quality inorganic insulating film and TFT can be formed in the subsequent processes.

In the semiconductor device 101, furthermore, an essential part of the single-crystal silicon thin-film transistor 130 is formed on the SOI substrate 150 before being integrated on the insulating substrate 110. That is to say, the single-crystal silicon thin-film transistor 130 is integrated on the insulating substrate 110 after the gate electrodes 133, gate insulating film 134, and single-crystal silicon thin film 135 are formed on the single-crystal silicon thin-film transistor 130. For this reason, compared to a case that a single-crystal silicon thin-film transistor is manufactured from a single-crystal silicon thin film formed on an insulating substrate 110, the present arrangement can realize more precise microfabrication and thinner single-crystal silicon thin film.

Also, the single-crystal silicon thin film 135 of the semiconductor device 101 is formed so as to have a uniform thickness not more than 20 nm. With this, it is possible to restrain the short channel effect that is intensified as the miniaturization of the transistor advances. In other words, the influences of the short channel effect are restrained to be negligible.

For instance, in the case of the semiconductor device 101 in which the gate length is 0.25 µm, while no particular changes are observed when the thickness of the single-crystal silicon thin film 135 is not more than 70 nm, the S value of the TFT increases and the off current remarkably increases when the thickness of the film 135 is increased to be in the range between 70 nm-100 nm and more. Thus, the short channel effect in the case of 0.25 µm gate length can be restrained to be practically negligible when the thickness of the single-crystal silicon thin film 135 is about not more than 70 nm. Note that, however, the short channel effect also depends on the variation of the doping concentration in the channel region.

In the meantime, on the occasion that the gate length is 0.13 µm, while no particular changes are observed when the thickness of the single-crystal silicon thin film 135 is about not more than 20 nm, the threshold value of the TFT decreases and the off current remarkably increases when the thickness of the film 135 is increased to be in the range between 20 nm-50 nm. Thus, the short channel effect in the case of 0.13 µm gate length can be restrained to be practically negligible when the thickness of the single-crystal silicon thin film 135 is about not more than 20 nm. Note that, however, the short channel effect also depends on the variation of the doping concentration in the channel region.

When hydrogen ions are implanted into the SOI substrate 150, the energy is adjusted in such a manner as to cause the distribution of the hydrogen ions to peak in the BOX layer 152. With this, a damaged layer including, for instance, dangling bond and defect, the layer being harmful in terms of electric characteristics and remaining on the surface of the SOI substrate 150 after being subjected to the cleavage, is confined only in the BOX layer 152.

Thus, the damaged layer on the SOI substrate 150 can be completely removed without impairing the uniformity of the thickness of the single-crystal silicon thin film 135, by selectively etching $SiO_2$ of the BOX layer 152 remaining on the SOI substrate 150, using, for instance, dilute hydrofluoric acid. In other words, even though methods such as CMP cannot be used for the reason that the single-crystal silicon thin film 135 is formed only on a part of the surface of the $SiO_2$ film 111, the surface damage can be removed without impairing the uniformity of the thickness of the single-crystal silicon thin film 135. For this reason, in the single-crystal silicon thin-film transistor 130, the decrease in characteristics due to the damage of the surface layer of the single-crystal silicon thin film 135 can be prevented without deteriorating the uniformity of the thickness of the film.

The semiconductor device 101 is arranged such that the MOS polycrystalline silicon thin-film transistor 120 and the MOS single-crystal silicon thin-film transistor 130 are formed in different regions on one insulating substrate 110. Thus, it is possible to realize a high-performance and highly functional semiconductor device in which a plurality of circuits having different characteristics are integrated.

In the semiconductor device 101, a group of polycrystalline silicon thin-film transistors 120 and a group of single-crystal silicon thin-film transistor 130 are formed in different regions. Thus, between a type of transistor in the former group and the identical conductivity type of transistor in the latter group, at least one of mobility, subthreshold coefficient, and threshold voltage is different. For this reason, it is possible to form transistors in suitable regions in order to attain required characteristics.

When, for instance, the semiconductor device 101 is adopted as an active matrix substrate of a liquid crystal display device, SiNx (silicon nitride), resin planarization film, via holes, and transparent electrode may be further formed on the semiconductor device 101, for the sake of liquid crystal display. In this case, in the region of the polycrystalline silicon thin film 122, a TFT for a driver and display section is formed. In the region of the single-crystal silicon thin film 135 adaptable to devices with higher performance, a timing controller can be formed. As a matter of course, the driver may be formed in the region of the single-crystal silicon thin film 135, and this improves the performance of the driver, compared to the case that the driver is formed in the region of the polycrystalline silicon thin film 122. In this manner, it is possible to form a driver which is smaller in size, excels in uniformity, and operates at a lower voltage.

As described above, the functions and applications of the thin-film transistor made up of the single-crystal silicon thin film 135 and the thin-film transistor made up of the polycrystalline silicon thin film 122 are determined in accordance with the characteristics thereof, so that high-performance and highly-functional thin-film transistors can be obtained.

While a conventional N-channel TFT formed in the region of the polycrystalline silicon thin film 122 has a mobility of about 100 cm$^2$/Vsec, an N-channel TFT formed in the region of the single-crystal silicon thin film 135 of the active matrix substrate for liquid crystal display, in the active matrix substrate the semiconductor device 101 being integrated, has a mobility of about 350 cm$^2$/Vsec. On this account, the semiconductor device 101 realizes a TFT which operates faster than conventional ones.

Furthermore, in this active matrix substrate for liquid crystal display, while not only the driver but also a device formed in the region of the polycrystalline silicon thin film 122 require a signal and power-supply voltage of 5V-8V, the timing controller which is a device formed in the region of the single-crystal silicon thin film 135 steadily operates at 1.5V. This shows that the semiconductor device 101 makes it possible to obtain a TFT whose power consumption is lower than those of conventional ones.

In the semiconductor device 101, furthermore, the integrated circuits are formed in the region of the polycrystalline silicon thin film 122 and in the region of the single-crystal silicon thin film 135, respectively. Thus, the integrated circuits are formed in suitable regions in consideration of required arrangement and characteristics, i.e., the integrated circuits formed in the respective regions have different characteristics such as working speed and working power'supply voltage. For instance, it is possible to design the devices in such a manner that, between the devices in the respective regions, at least one of the gate length, thickness of the gate insulating film, power-supply voltage, and logic level is different. In other words, it is possible to form devices having different characteristics in the respective regions, and thus obtain a semiconductor device having greater variety of functions.

In the semiconductor device 101, furthermore, the integrated circuits are formed in the region of the polycrystalline silicon thin film 122 and in the region of the single-crystal silicon thin film 135, respectively. Thus, the integrated circuits in the respective regions can be formed in different manufacturing rules, in accordance with the characteristics of the respective regions. For instance, in the case of a short-channel-length TFT, while the variation of the TFT characteristics rarely increases in the single-crystal silicon thin film region as the region has no crystal grain boundary, the variation of the TFT characteristics rapidly increases in the polycrystalline silicon thin film region because of the crystal grain boundary. For this reason, it is necessary to set different manufacturing rules in the single-crystal silicon thin film region and the polycrystalline silicon thin film region.

Incidentally, the size of the single-crystal silicon thin film 135 formed on the semiconductor device 101 is determined in accordance with the wafer size of an LSI manufacturing apparatus. However, a typical wafer size of a LSI manufacturing apparatus suffices for manufacturing members such as a high-speed logic and timing generators, high-speed DAC (current buffer), and processor, which meet the speed, power consumption, and variation required by the single-crystal silicon thin film 135.

The single-crystal silicon thin-film transistor 130 and the polycrystalline silicon thin-film transistor 120 are not limited to the above. For instance, a bottom-gate MOS thin-film transistor and a bipolar thin-film transistor can realize effects similar to the above.

As the insulating substrate 110 of the semiconductor device 101, in the present case Code 1737 (alkaline-earth alumino-borosilicate glass) of Corning®, which is a high strain point glass is adopted. However, the present invention is not limited to this so that high strain point glasses such as barium alumino-borosilicate glass, alkaline-earth alumino-borosilicate glass, borosilicate glass, alkaline-earth-zinc-lead-alumino-borosilicate glass, and alkaline-earth-lead-alumino-borosilicate glass may be adopted.

Note that, however, when Code 7059 (barium-borosilicate glass) of Corning® is adopted as the insulating substrate 110 instead of Code 1737, the bonding can be carried out in a manner similar to the case of adopting Code 1737, but the success rate of cleavage significantly decreases.

Figure 6:
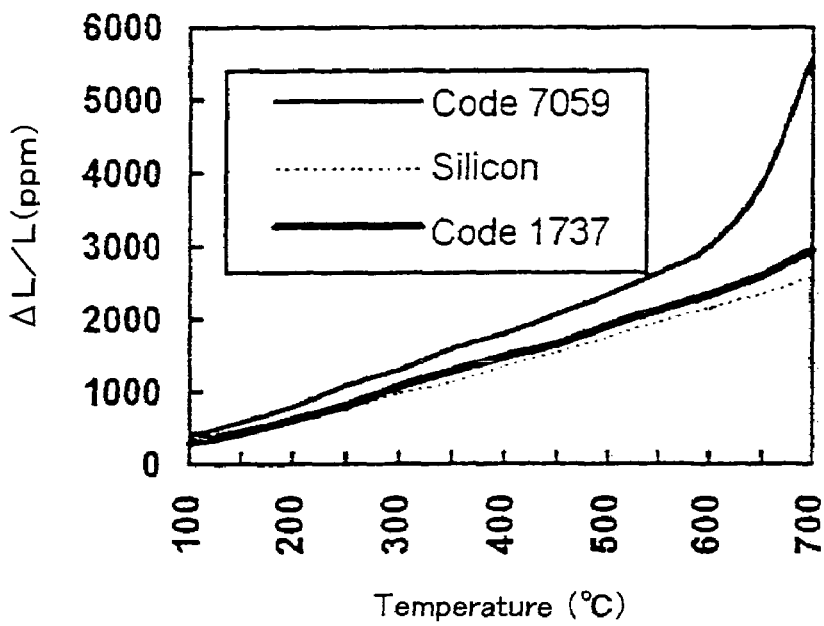
FIG. 6 is a graph showing the difference of linear expansion between single-crystal silicon and two types of glass substrates, at temperatures of 100° C.-700° C.

This is because, as shown in FIG. 6, while the difference of linear expansion between Code 1737 and silicon is about 250 ppm, the difference of linear expansion between Code 7059 and silicon is as much as about 800 μm at temperatures from room temperatures (RT) to 600° C.

Thus, in order to increase the success rate of the cleavage, the difference of linear expansion between the insulating substrate and silicon at temperatures from room temperatures to 600° C. is preferably about not more than 250 μm.

Further, the insulating substrate 110 is preferably a high strain point glass whose strain point is not less than 500° C. With this, it is possible to reduce, in the manufacturing process, limitations in the quality of the silicon oxidized film, activation of impurities, and damage recovery, so that the productivity is improved. Moreover, since heating is carried out after bonding the SOI substrate 150 with the insulating substrate 110, the bonding strength therebetween is enhanced.

The single-crystal silicon thin-film transistor of the semiconductor device 101 is arranged such that, from the insulating substrate 110 side, the gate electrodes 133, gate insulating film 134, and single-crystal silicon thin film 135 are provided in this order. With this arrangement, the process of bonding the single-crystal silicon thin film 135 with the metal interconnects 140 can be easily implemented so that good productivity is realized.

For instance, a single-crystal region of the semiconductor device 101 of the present embodiment is arranged such that, from the insulating substrate 110 side, the gate electrodes 133, gate insulating film 134, single-crystal silicon thin film 135, and metal interconnects 140 are provided in this order. However, the present invention is not limited to this arrangement.

For instance, on at least any one of: the gate electrodes 133; gate insulating 134; and single-crystal thin film 135, an interlayer insulating film and metal interconnects layer may be provided. In this manner, in line with required characteristics, it is possible to design various types of single-crystal silicon thin-film devices.

Moreover, the process of bonding the SOI substrate 150 with the insulating substrate 110 in the manufacturing method of the semiconductor device 101 may be carried out in a vacuum. With this, it is possible to restrain bonding errors.

The method of the present embodiment may be used for forming a single-crystal silicon thin-film device substantially on the entire surface of the insulating substrate 110. Also in this case, it is possible to realize a single-crystal silicon thin-film device which is thin, uniform in thickness, and with no surface damages.

Note that, although in the present embodiment the insulating substrate 110 and the SOI substrate 150 are cleaned and activated by RCA (SC-1) clean, this is not the only method to clean and activate these substrates. For instance, hydrogen peroxide may be used instead of SC-1, or an oxygen plasma treatment may be carried out instead of RCA (SC-1) clean.

Embodiment 2

The following will discuss another embodiment of a semiconductor device of the present invention and a manufacturing method thereof, with reference to figures. By the way, members having the same functions as those described in the semiconductor device 101 of Embodiment 1 are given the same numbers, so that the descriptions are omitted for the sake of convenience.

Being similar to the semiconductor device 101 of Embodiment 1, a semiconductor device 201 of the present embodiment is arranged in such a manner that a polycrystalline silicon thin-film transistor 120 and a MOS single-crystal silicon thin-film transistor 230 are integrated in different regions on an insulating substrate, and the device 201 is utilized for, for instance, an active matrix substrate.

For this reason, the semiconductor device 201 is arranged identical with the semiconductor device 101 of Embodiment 1.

However, the semiconductor device 201 is different from the semiconductor device 101 of Embodiment 1 in the following points: (i) Instead of the SOI substrate, a double-layered silicon substrate 250 (single-crystal silicon substrate) in which a porous silicon layer is formed is adopted, and (ii) after bonding the double-layered silicon substrate 250 with the insulating substrate 110, an unnecessary part of the double-layered silicon substrate 250 is separated at the porous silicon layer 255.

Figure 9:
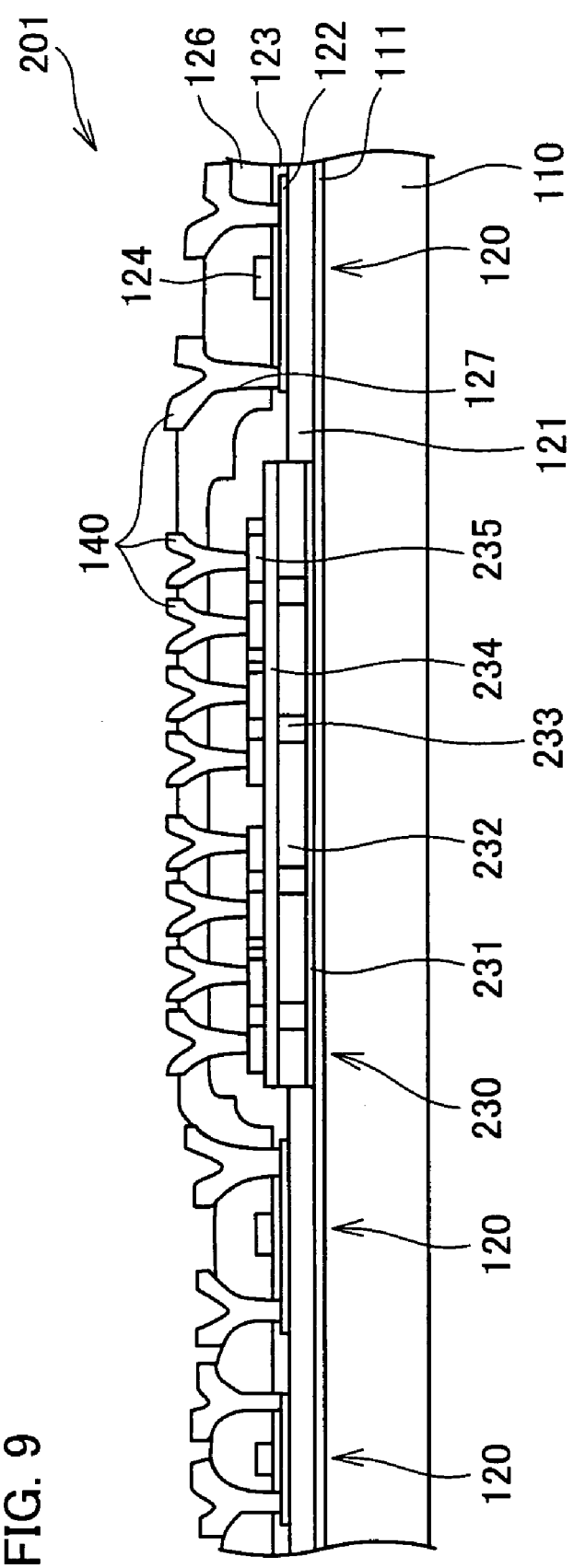
FIG. 9 is an enlarged view of FIG. 2(h).

As FIG. 9 shows, the semiconductor device 201 is arranged such that, on the insulating substrate 110, an $SiO_2$ film 111, MOS polycrystalline silicon thin-film transistor 120 including a polycrystalline silicon thin film 122, MOS single-crystal silicon thin-film transistor 230 including a single-crystal silicon thin film 235, and metal interconnects 140 are provided.

As in Embodiment 1, the entire surface of the insulating substrate 110 is covered with the $SiO_2$ film 111 which is about 100 nm thick. Also, the MOS polycrystalline silicon thin-film transistor 120 including the polycrystalline silicon thin film 122 is formed on an interlayer insulating film ($SiO_2$ film) formed on the $SiO_2$ film 111.

On the other hand, the MOS single-crystal silicon thin-film transistor 230 including the single-crystal silicon thin film 235 is formed in a region on the $SiO_2$ film 111, the region being different from the region in which the polycrystalline silicon thin-film transistor 120 is formed. Note that, the single-crystal silicon thin-film transistor 230 is arranged such that, on the $SiO_2$ film 111, an $SiO_2$ film 231 which is about 10 nm thick, planarization film 232, gate electrodes 233, gate insulating film 234 which is about 15 nm, and single-crystal silicon thin film 235 which is island-shaped and about 20 nm thick are provided in this order.

On the polycrystalline silicon thin-film transistor 120 and single-crystal silicon thin-film transistor 230, an interlayer insulating film ($SiO_2$ film) 126 is provided above the entire surface of the insulating substrate 110. The interlayer insulating film 126 has openings (contact holes 127), and in these contact holes 127, metal interconnects 140 made of metal such as Al—Si alloy are formed, respectively. The metal interconnects 140 are formed from the top surfaces of respective island-shaped regions of the polycrystalline silicon thin film 122 and the singe-crystal silicon thin film 235.

Now a method of manufacturing the semiconductor device 201 will be discussed with reference to FIGS. 2(a)-2(h).

First, as shown in FIG. 2(a), the $SiO_2$ film 111 which is about 50 nm thick is deposited so as to cover the entire surface of the insulating substrate 110, by plasma CVD using a mixed gas of TEOS and $O_2$.

Next, as FIG. 2(b) shows, the double-layered silicon substrate 250 which is made up of the single-crystal silicon thin film 235 on which the single-crystal silicon thin-film transistor 230 has independently been formed and the porous silicon layer 255 is formed. Then this double-layered silicon substrate 250 is bonded with the insulating substrate 110.

Now a method of manufacturing this double-layered silicon substrate 250 is discussed (cf. FIG. 2(b)). First, a silicon wafer is immersed into a mixture of hydrofluoric acid and ethanol, and then the porous silicon layer 255 is formed by connecting the silicon wafer to the anode and subjecting the silicon wafer to anodization. In this case, the porous silicon layer 255 has two types of pores, namely pores with diameters of several nm and pores with diameters of 5-10 nm. This is for facilitating the following cleavage process. Note that, the pore diameter and layer thickness can be controlled by changing the condition of anodization (e.g. applied current and time for the anodization).

Subsequently, on the surface of the porous silicon layer 255 having been formed as above, a thin oxidized layer (not illustrated) is formed at temperatures of 400-500° C., so that the surface of the porous silicon layer 255 is stabilized. Then heat treatment is carried out at about not less than 1000° C. and in a hydrogen atmosphere, thereby sealing the pores on the surface of the porous silicon layer 255. Further on this porous silicon layer 255, the single-crystal silicon thin film 235 on which an epitaxial layer is grown in a gas phase is formed.

Then a part of the CMOS process is carried out on the porous silicon layer 255 in a typical IC manufacturing line. That is to say, on the porous silicon layer 255, the following members are formed: the single-crystal silicon thin film 235 to which source and drain impurity ions ($BF_2^+$ and $P^{30}$) are implanted and whose P-type and N-type channel regions are channel-doped by ion implantation; the gate insulating film 234, gate electrodes 233, planarization film 232 (BPSG film), and protective insulating film (not illustrated). The planarization film 232 is formed in such a manner that, after depositing $SiO_2$ and BPSG by CVD, the BPSG is melted, $SiO_2$ is further deposited by CVD or plasma CVD using, for instance, TEOS, and then planarization by CMP is carried out. Alternatively, the planarization film 232 may be formed in one of the following two ways: After depositing $SiO_2$ by a method such as CVD, the $SiO_2$ is etched by RIE so that only concave regions (regions without gate patterns) of the substrate remain, $SiO_2$ is further deposited thereon by a method such as CVD and plasma CVD using TEOS, etc., and then planarization is carried out by CMP; or, after depositing $SiO_2$ by a method such as CVD and plasma CVD using TEOS, etc., the $SiO_2$ is etched by RIE so that only concave regions (areas without gate patterns) of the substrate remain, $SiO_2$ is further deposited thereon by methods such as CVD and plasma CVD using TEOS, etc., and then planarization is carried out by CMP. Subsequently, on the planarization film 232, the $SiO_2$ film 231 which is about 10 nm thick is formed.

In this manner, the double-layered silicon substrate 250 including the porous silicon layer 255 and single-crystal silicon is formed, i.e. the double-layered silicon substrate 250 made up of porous silicon and epitaxial-grown single-crystal silicon is formed.

Note that, the gate length of the gate electrodes 233 of the semiconductor device 201 is 0.25 μm.

Next, the double-layered silicon substrate 250 having been formed as above is cut so as to have a predetermined size in conformity to a bonding region on the insulating substrate 110.

Then the insulating substrate 110 and the double-layered silicon substrate 250 having been cut are cleaned and activated by carrying out RCA (SC-1) clean. Furthermore, that surface of the double-layered silicon substrate 250 which is on the $SiO_2$ film 231 side is aligned with a predetermined region on the insulating substrate 110, and the surface and the predetermined region are caused to closely contact each other so as to be bonded with each other at room temperatures.

Subsequently, heat treatment at temperatures of 300-600° C., in this case at about 550° C. is carried out, so that the bonding strength between the double-layered silicon substrate 250 and insulating substrate 110 is enhanced.

Next, water jet is applied to the porous silicon layer 255 of the double-layered silicon substrate 250, so as to cleave an unnecessary part 253 of the double-layered silicon substrate, at the porous silicon layer 250 as a border (cf. FIG. 2(c)). Note that, the cleavage at the porous silicon layer 250 can be carried out by soaking the porous silicon layer 255 with water and then decreasing a temperature of the layer 255 to be below 0° C.

Then the cleaved surface of the porous silicon layer 255 is etched using a mixture of hydrofluoric acid and hydrogen peroxide, the mixture being diluted by deionized water, so that the cleaved surface is planarized.

Subsequently, an unnecessary part (porous silicon layer 255a) of the double-layered silicon substrate, the unnecessary part remaining on the insulating substrate 110 after the cleavage, is removed by etching. Then the single-crystal silicon thin film 235 is caused to be island-shaped, so that, as in FIG. 2(d), a part of the MOS TFT, in this case the single-crystal silicon thin film 235 which is about 20 nm thick, is formed on the insulating substrate 110.

Next, as shown in FIG. 2(e), above the entire surface of the insulating substrate 110, the $SiO_2$ film 121 which is about 100 nm thick is deposited by plasma CVD using a mixed gas of $SiH_4$ and $N_2O$. Further, on the entire surface of the $SiO_2$ film 121, an amorphous silicon film 122a which is about 50 nm is deposited by plasma CVD using $SiH_4$ gas.

An excimer laser is then applied to the amorphous silicon film 122a so as to heat and crystallize the same. With this, a polycrystalline silicon layer is grown so that the polycrystalline silicon thin film 122 is formed (cf. FIG. 2(f)). Note that, this application of the excimer laser also improves the bonding strength between the $SiO_2$ film 231 on the single-crystal silicon thin film 235 and the $SiO_2$ film 111 on the insulating substrate 110.

Subsequently, as FIG. 2(g) shows, an unnecessary part of the polycrystalline silicon thin film 122 and at least that part of the $SiO_2$ film 121 which is on the single-crystal silicon thin film 235 are removed by etching, in order to remove parts other than a part to be an active region of the device. In this process, the unnecessary part is removed in such a manner as to cause the polycrystalline silicon thin film 122 to be island-shaped in line with a predetermined shape of the device.

Next, using a mixed gas of TEOS and ozone, an $SiO_2$ film which is about 350 nm thick is deposited by plasma CVD, and the deposited layers are etched back for about 400 nm by RIE (Reactive Ion Etching) which is a type of anisotropic etching. Subsequently, by plasma CVD using a mixed gas of $SiH_4$ and $N_2O$, a gate insulating film ($SiO_2$ film) 123 of the polycrystalline silicon thin-film transistor 120, the film 123 being about 60 nm thick, is formed.

As shown in FIGS. 2(g)-2(h), subsequent operations are identical with those of a typical process of manufacturing a polysilicon TFT. Namely, the gate electrodes 124 are formed on the gate insulating film 123, and impurity ions for $N^{30}$ and $P^{30}$ are implanted into the polycrystalline silicon thin film 122. Then by plasma CVD using a mixed gas of TEOS and $O_2$, the interlayer insulating film 216 which is about 350 nm thick is deposited. Subsequently, the contact holes 127 are perforated and the metal interconnects 140 are formed therein.

Note that, the diameter of each contact hole 127 and the width of each metal interconnects 140 are determined to be 2 μm, taking into consideration of the accuracy of photolithography in a large-sized glass substrate and the precision of the alignment on the occasion of the bonding.

To support liquid crystal display, furthermore, $SiN_x$ (silicon nitride), resin planarization film, via holes, and transparent-electrode are successively formed, a TFT for a driver and a display section is formed by a polycrystalline silicon TFT, and a timing controller is formed by a single-crystal silicon TFT.

As described above, the semiconductor device 201 is formed in the following manner: The double-layered silicon substrate 250 including the single-crystal silicon thin-film transistor 230 and porous silicon layer 255 is bonded with the insulating substrate 110, and then the unnecessary part 253 of the double-layered silicon substrate is cleaved at the porous silicon layer 255. That is, water jet is applied to the porous silicon layer 255 or the porous silicon layer 255 is soaked with water and then a temperature of the porous silicon layer 255 is caused to be below 0° C., so that the cleavage is carried out at the porous silicon layer 255 as a border. In this manner, no adhesive is used in the process of bonding the SOI substrate including at least a device structure with the insulating substrate 110.

For this reason, the bonding region excels in heat resistance and hence a high-quality inorganic insulating film and TFT can be formed in processes after the bonding.

Furthermore, in the semiconductor device 201, an essential part of the single-crystal silicon thin-film transistor 230 is formed on the double-layered silicon substrate 250, before bonding the substrate 250 with the insulating substrate 110. That is to say, the double-layered silicon substrate 250 including the gate electrodes 233, gate insulating film 234, and single-crystal silicon thin film 235 is bonded with the insulating substrate 110. This makes it possible to realize more precise micro-fabrication and easily form a thinner single-crystal silicon thin film, compared to a case that a single-crystal silicon thin-film transistor is formed from a single-crystal silicon thin film formed on the insulating substrate 110.

Thus, the influences of the short channel effect, which becomes eminent as the micro-fabrication of a transistor advances, are restrained. That is to say, it is possible to keep the thickness of the single-crystal silicon thin film 235 of the semiconductor device 201 to be not more than 20 nm and uniform, and hence the influences of the short channel effect is restrained to be negligible.

For instance, in the case of the semiconductor device 201 in which the gate length is 0.25 μm, while no particular changes are observed when the thickness of the single-crystal silicon thin film 235 is not more than 70 nm, the S value of the TFT increases and the off current remarkably increases when the thickness of the film 235 is increased to be in the range between 70 nm-100 nm and more. Thus, the short channel effect in the case of 0.25 μm gate length can be restrained to be practically negligible when the thickness of the single-crystal silicon thin film 235 is about not more than 70 nm. Note that, however, the short channel effect also depends on the variation of the doping concentration in the channel region.

In the meantime, on the occasion that the gate length is 0.13 μm, while no particular changes are observed when the thickness of the single-crystal silicon thin film 235 is about not more than 20 nm, the threshold value of the TFT decreases and the off current remarkably increases when the thickness of the film 235 is increased to be in the range between 20 nm-50 nm. Thus, the short channel effect in the case of 0.13 μm gate length can be restrained to be practically negligible when the thickness of the single-crystal silicon thin film 135 is about not more than 20 nm. Note that, however, the short channel effect also depends on the variation of the doping concentration in the channel region.

Also, a layer damaged due to reasons such as dangling bond and crystal defect, the layer remaining on the surface of the double-layered silicon substrate 250 and being harmful in terms of electric properties, is confined only in the porous silicon layer 255.

Thus, the damaged layer on the double-layered silicon substrate 250 can be completely removed without impairing the uniformity of the thickness of the single-crystal silicon thin film 235, by etching and removing the porous silicon layer 255 remaining on the surface of the double-layered silicon substrate 250. In other words, even though methods such as CMP cannot be used for the reason that the single-crystal silicon thin film 235 is formed only on a part of the surface of the $SiO_2$ film 111, the surface damage can be removed without impairing the uniformity of the thickness of the single-crystal silicon thin film 235. For this reason, in the single-crystal silicon thin-film transistor 230, the decrease in characteristics due to the damage of the surface layer of the single-crystal silicon thin film 235 can be prevented while the uniformity of the thickness of the film is not deteriorated.

Note that, in the single-crystal silicon thin-film transistor 230, the number of defects in single-crystal silicon is far smaller than that of the single-crystal silicon thin-film 130 of Embodiment 1. This is due to the following reason: Temperatures in processes after the process of bonding the double-layered silicon substrate 250 with the insulating substrate 110 should not be raised above 600° C. However, even if the temperatures are not less than 600° C., the implantation of hydrogen ions is not carried out, so that the number of defects in single-crystal silicon is extremely small.

For this reason, the single-crystal silicon thin-film transistor 230 is superior to the single-crystal silicon thin-film transistor 130 of Embodiment 1, in mobility, threshold voltage, and S-coefficient.

For instance, a conventional N-channel TFT formed in a region of the polycrystalline silicon thin film 222 has a mobility of about 100 $cm^2/Vsec$. Also, in an active matrix substrate for liquid crystal display, in which the semiconductor device 101 of Embodiment 1 is integrated, an N-channel TFT formed in a region of the single-crystal silicon thin film 235 has a mobility of about 350 $cm^2/Vsec$. In the meantime, in an active matrix substrate for liquid crystal display, in which the semiconductor device 201 is integrated, an N-channel TFT formed in a region of the single-crystal silicon thin film 235 has a mobility of about 400 $cm^2/Vsec$. This indicates that the semiconductor device 201 realizes a TFT which can operate quicker than conventional ones.

Note that, in this active matrix substrate for liquid crystal display, while not only the driver but also a device formed in the region of the polycrystalline silicon thin film 122 require a signal and power-supply voltage of 5V-8V, the timing controller which is a device formed in the region of the single-crystal silicon thin film 235 steadily operates at 1.5V. This shows that the semiconductor device 201 can realize a TFT whose power consumption is less than that of conventional ones.

Note that, although in the present embodiment the insulating substrate 110 and the double-layered silicon substrate 250 are cleaned and activated by RCA (SC-1) clean, this is not the only method to clean and activate these substrates. For instance, hydrogen peroxide may be used instead of SC-1, and an oxygen plasma treatment may be carried out instead of RCA (SC-1) clean.

Apart from the above, the semiconductor device 201 and members constituting the device 201 function and effect similar to those of the semiconductor device 101 of Embodiment 1 and the members of the semiconductor device 101. The details concerning this are omitted here.

Embodiment 3

The following will describe a further embodiment of a semiconductor device of the present invention and a method of manufacturing the same. By the way, members having the same functions as those described in the semiconductor device 101 of Embodiment 1 are given the same numbers, so that the descriptions are omitted for the sake of convenience.

Figure 10:
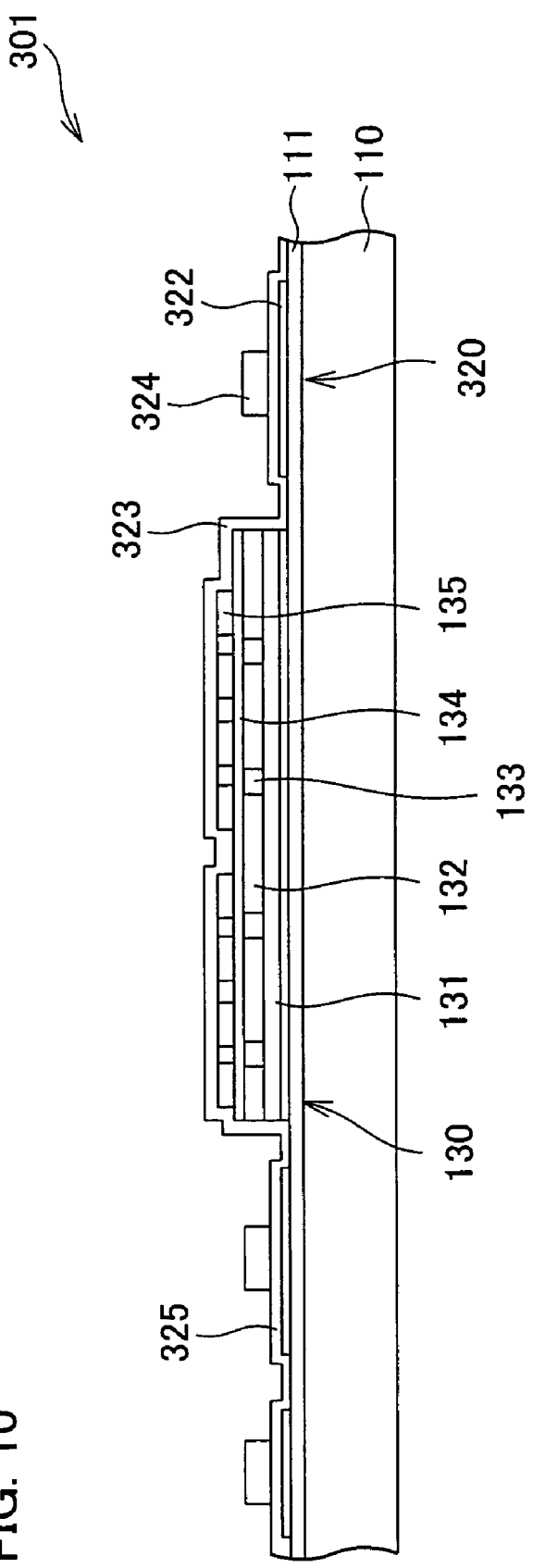
FIG. 10 is an enlarged view of FIG. 3(g).

As shown in FIG. 10, a semiconductor device 301 of the present embodiment is identical with the semiconductor device 101 of Embodiment 1 to the extent that a single-crystal silicon thin film device and a non-single-crystal silicon thin film device are formed in different regions on an insulating substrate.

Note that, however, the semiconductor device 301 is different from the semiconductor device 101 of Embodiment 1 to the extent that the non-single-crystal silicon thin film device is formed from a continuous grain silicon thin film 322. The continuous grain silicon is polycrystalline silicon formed in such a way that, by adding a small amount of metal, the direction of crystal growth is uniformed so that the crystal growth is accelerated.

As shown in FIG. 10, the semiconductor device 301 is arranged such that, on the insulating substrate 110, an $SiO_2$ film 111, MOS continuous grain silicon thin-film transistor 320 including a continuous grain silicon thin film 322, and MOS single-crystal silicon thin-film transistor 130 including a single-crystal silicon thin film 135 are provided. Note that, From FIG. 3(g), members (e.g. interlayer planarization film and metal interconnects) formed after the formation of gate electrodes 324 of the continuous grain silicon thin-film transistor are omitted as those members are identical with those in Embodiment 1.

As in Embodiment 1, on the entire surface of the insulating substrate 110, the $SiO_2$ film 111 which is about 100 nm thick is formed. Then on this $SiO_2$ film 111, the MOS continuous grain silicon thin-film transistor 320 including the continuous grain silicon thin film 322 is formed. In other words, on the $SiO_2$ film 111, the continuous grain silicon thin film 322, $SiO_2$ film (insulating film, oxidized film) 325, gate insulating film 323, and gate electrodes 324 are provided in this order. The continuous grain silicon thin film 322 formed on the $SiO_2$ film 111 is island-shaped and about 40 nm thick. The gate insulating film 323 is about 60 nm thick and formed above the entire surface of the continuous grain silicon thin film 322.

On the other hand, the MOS single-crystal silicon thin-film transistor 130 including the single-crystal silicon thin film 135 is formed in a manner similar to the MOS single-crystal silicon thin-film transistor of the semiconductor device 101 of Embodiment 1. That is to say, on the $SiO_2$ film 111, the MOS single-crystal silicon thin-film transistor 135 is formed in a region different from the region where the continuous grain silicon thin-film transistor 320 is formed.

Further, on the continuous grain silicon thin-film transistor 320 and the single-crystal silicon thin-film transistor 130, members (not illustrated) such as a gate insulating film, interlayer insulating film, and metal interconnects are formed.

Now, a method of manufacturing the semiconductor device 301 is discussed.

First, as shown in FIG. 3(a), on the entire surface of the insulating substrate 110, the $SiO_2$ film 111 which is about 100 nm thick is deposited by plasma CVD using a mixed gas of TEOS and $O_2$. Then on the entire surface of this $SiO_2$ film 111, an amorphous silicon film 322a which is about 50 nm thick is deposited by plasma CVD using $SiH_4$ gas.

As shown in FIG. 3(b), furthermore, a second $SiO_2$ film 390 which is about 200 nm thick is deposited on the entire surface of the amorphous silicon film 322a, by plasma CVD using a mixed gas of $SiH_4$ and $N_2O$.

Then in a predetermined region of the second $SiO_2$ film 390 formed on the amorphous silicon film 322a, an opening 391 is formed by etching.

Next, in the process shown in FIG. 3(c), above the opening 391, the surface of the amorphous silicon film 322a is thinly oxidized so that an oxidized film ($SiO_2$ film, not illustrated) is formed. This oxidized film is formed for controlling the hydrophilicity of the surface of the amorphous silicon film 322a above the opening 391. Then the oxidized film is spin-coated by a nickel acetate aqueous solution. Furthermore, a solid-phase growth is carried out for about 8 hours at 580° C., so that continuous grain silicon is grown and the continuous grain silicon thin film 322 is formed. Consequently, the continuous grain silicon thin film 322 which is about 40 nm thick is formed. Note that, apart from nickel, metal atoms of, for instance, platinum, tin, and palladium can be used for forming the continuous grain silicon. Next, to the opening 391, high-concentration $P^{30}$ ions (15 keV, $5 \times 10^{15}/cm^2$) are implanted. Furthermore, heat treatment is carried out at about 800° C. and for one minute by RTA (Rapid Thermal Anneal). With this, it is possible to subject nickel which is added for accelerating the crystal growth using the $SiO_2$ film 390 as a mask.

Subsequently, the $SiO_2$ film on the continuous grain silicon thin film is etched and totally removed. Further, a predetermined region of the continuous grain silicon thin film 322 is etched and removed (see FIG. 3(c)). Then the $SiO_2$ film 325 which is about 50 nm thick is deposited so as to cover the entire surface of the glass substrate, by a method such as plasma CVD using a mixed has of TEOS and $O_2$ (see FIG. 3(d)).

Next, the SOI substrate 150, on which the single-crystal silicon thin-film transistor 130 has independently been formed and hydrogen ions having a predetermined concentration are implanted to a predetermined depth, is cut so as to have a predetermined size in conformity to a bonding region on the insulating substrate 110. Note that, on this occasion, the SOI substrate 150 is cut so as to be at least 0.3 micrometer, preferably not less than 0.5 micrometer smaller than the predetermined region (region from which the continuous grain silicon thin film 322 is etched and removed) on the insulating substrate 110.

Then, as FIG. 3(e) shows, the SOI substrate 150 is bonded with the insulating substrate 110 in the same manner as in Embodiment 1.

To do this, the insulating substrate 110 and the SOI substrate 150 are cleaned and activated by carrying out RCA (SC-1) clean. Furthermore, that surface of the SOI substrate 150 which is on the $SiO_2$ film 131 side is aligned with the predetermined region on the insulating substrate 110, and the surface and the predetermined region are caused to closely contact each other so as to be bonded with each other at room temperatures. On this occasion, the distance between the continuous grain silicon thin film 322 and the single-crystal silicon substrate 150 is at least 0.3 micrometer, preferably not less than 0.5 micrometer. This makes it possible to prevent proliferation of nickel atoms, which are used in the process of forming the continuous grain silicon thin film 322, to the single-crystal silicon region, so that the characteristics are unaffected.

Next, by carrying out laser radiation or lamp annealing at a peak temperature about not less than 700° C., a temperature of the hydrogen ion implantation section 151 on the SOI substrate 150 is increased to be not less than a temperature at which hydrogen dissociates away from silicon. With this, an unnecessary part 153 of the SOI substrate 150 bonded with the insulating substrate 110 is cleaved at the hydrogen ion implantation section 151 as a border (see FIG. 3(f)).

Subsequently, as shown in FIG. 3(g), a BOX layer 152a on the surface of the SOI substrate 150, which remains on the insulating substrate 110 after the cleavage, is etched using diluted hydrofluoric acid and removed. In other words, the BOX layer 152a including the damaged layer is selectively removed. On this occasion, $SiO_2$ on the continuous grain silicon is also removed. An unnecessary part of the continuous grain silicon thin film 322 and an unnecessary part of the single-crystal silicon thin film 135 are removed by etching so that an island-shaped active region of the device is obtained. As a result, the single-crystal silicon thin film 135 which is about 20 nm thick and the continuous grain silicon thin film 322 which is about 40 nm thick are formed on the insulating substrate 310.

Next, an $SiO_2$ film which is about 350 nm is deposited by plasma CVD using a mixed gas of TEOS and $O_2$, and etchback for about 370 nm is carried out by RIE. Then, as a gate insulating film, an $SiO_2$ film 323 which is about 60 nm thick is formed by plasma CVD using a mixed gas of $SiH_4$ and $N_2O$. Simultaneously, side walls are formed at the respective ends of the patterns of the continuous grain silicon thin film 322 and the single-crystal silicon thin film 135.

The following processes are identical with those in Embodiment 1. That is to say, after forming the gate insulating film 323, the gate electrodes 324, interlayer planarization insulating film (not illustrated), and metal interconnects (not illustrated) are formed thereon. In this manner, on the insulating substrate 110, the MOS continuous grain silicon thin-film transistor 320 and the MOS single-crystal silicon thin-film transistor 130 are formed (see FIG. 3(h)).

As described above, the semiconductor device 301 is arranged such that, in different regions on one insulating substrate, a MOS non-single-crystal silicon thin-film transistor and a MOS single-crystal silicon thin-film transistor are formed. To this extent, the semiconductor device 301 is identical with the semiconductor device 101 of Embodiment 1.

For this reason, the semiconductor device 301 bring about effects similar to those of the semiconductor device 101 of Embodiment 1.

It is noted that, however, the non-single-crystal silicon thin-film transistor of the semiconductor device 301 is made up of the continuous grain silicon thin-film transistor 320. For this reason, in the semiconductor device 301, the mobility in the non-single-crystal silicon thin-film transistor region is higher than the mobility in the semiconductor device 101 of Embodiment 1. That is to say, while the mobility of a conventional N-channel TFT formed in a polycrystalline silicon region is about 100 $cm^2$/Vsec, the mobility of a conventional N-channel TFT formed in a continuous grain silicon region is about 200 $cm^2$/Vsec. This indicates that the continuous grain silicon has better crystallinity.

Thus, when designing a semiconductor device in which a single-crystal silicon thin-film transistor and a non-single-crystal silicon thin-film transistor are formed in different regions on an insulating substrate, it is possible to select a type of thin film on which a TFT is formed, in accordance with a required mobility of the non-single-crystal silicon thin-film transistor in order to obtain desirable characteristics.

Note that, the semiconductor device 301 may be formed using the double-layered silicon substrate 250 in Embodiment 2 instead of the SOI substrate 150. When the double-layered silicon substrate 250 is adopted, the mobility of the single-crystal silicon thin-film transistor is higher than the mobility in the case of adopting the SOI substrate 150.

Note that, although in the present embodiment the insulating substrate 110 and the SOI substrate 150 are cleaned and activated by RCA (SC-1) clean, this is not the only method to clean and activate these substrates. For instance, hydrogen peroxide may be used instead of SC-1, and an oxygen plasma treatment may be carried out instead of RCA (SC-1) clean.

Embodiment 4

The following will describe yet another embodiment of a semiconductor device of the present invention and a method of manufacturing the same, with reference to figures. By the way, members having the same functions as those described in the semiconductor device 101 of Embodiment 1 are given the same numbers, so that the descriptions are omitted for the sake of convenience.

Figure 11:
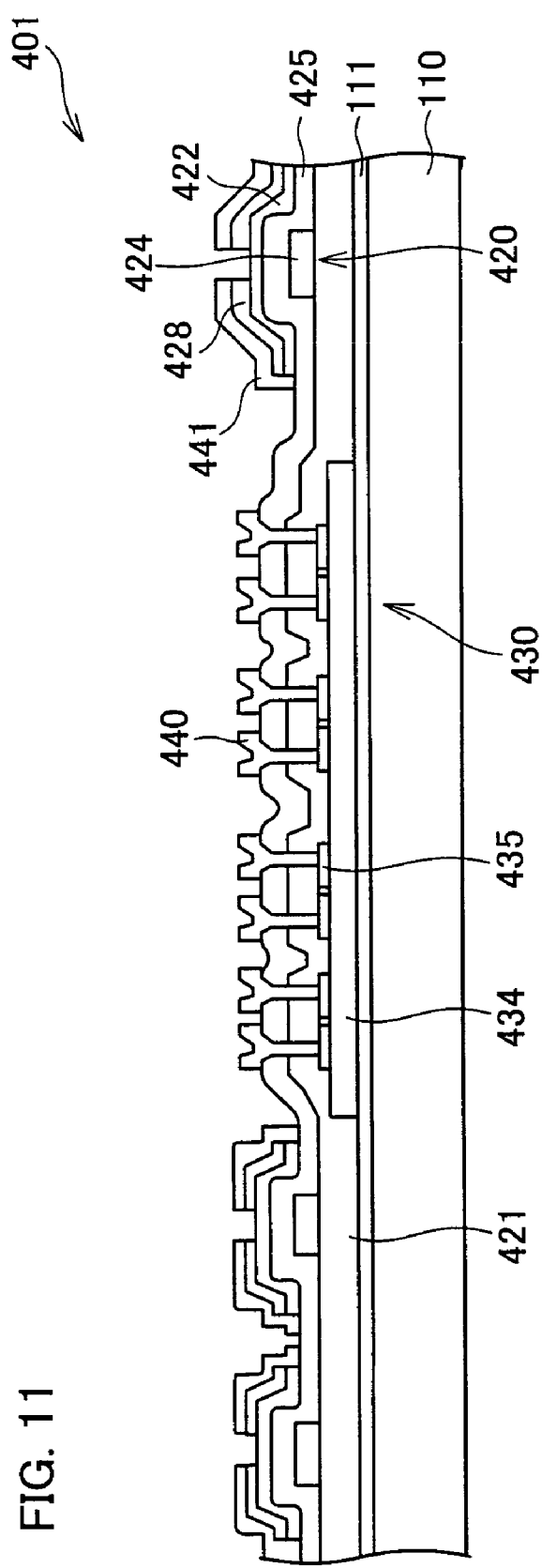
FIG. 11 is an enlarged view of FIG. 4(g).

As FIG. 11 illustrates, a semiconductor device 401 of the present embodiment is identical with the semiconductor device 101 of Embodiment 1, to the extent that a single-crystal silicon thin film device and a non-single-crystal silicon thin film device are formed in different regions on an insulating substrate. The semiconductor device 401 is utilized as, for instance, an active matrix substrate.

It is noted that, however, the semiconductor device 401 is different from the semiconductor device 101 of Embodiment 1 to the extent that a non-single-crystal silicon thin-film device is an amorphous silicon thin film.

Also, the semiconductor device 401 is different from the semiconductor device 101 of Embodiment 1 to the extent that a single-crystal silicon thin-film device is a bipolar transistor.

As shown in FIG. 11, the semiconductor device 401 is arranged in such a manner that, on an insulating substrate 110, an $SiO_2$ film 111, amorphous silicon thin-film transistor 420 including an amorphous silicon thin film 422, and bipolar transistor (single-crystal silicon thin-film device) 430 made from a single-crystal silicon thin film 435 are provided.

As in Embodiment 1, the semiconductor device 401 is formed in the following manner: On the entire surface of the insulating substrate 110, the $SiO_2$ film 111 which is about 100 nm thick is formed. Then on the $SiO_2$ film 111, the amorphous silicon (non-single-crystal silicon) thin-film transistor 420 including the amorphous silicon (non-single-crystal silicon) thin film 422 is formed. That is to say, the amorphous silicon thin-film transistor 420 is arranged such that, on the $SiO_2$ film 111, an interlayer insulating film ($SiO_2$ film) 421, gate electrodes 424, gate insulating film 425, non-doped amorphous silicon thin film 422, $N^{30}$ amorphous silicon thin film 428, and metal electrode 441 for source and drain lines are provided in this order.

On the other hand, on the $SiO_2$ film 111, the bipolar transistor 430 is formed in a region different from the region where the amorphous silicon thin-film transistor 420 is formed.

This bipolar transistor 430 is arranged such that, on the $SiO_2$ film 111, an interlayer insulating film 434, single-crystal silicon thin film 435 including parts turning into collector, base, and emitter, and metal interconnects 440. The metal interconnects 440 are connected to the single-crystal silicon thin film 435 via openings perforated through the interlayer insulating film 421 and gate insulating film 425.

For liquid crystal display, above the amorphous silicon thin-film transistor 420 and the bipolar transistor 430, a protective film, planarization film, and transparent conductive film for carrying out displaying are formed (not illustrated).

Now, a method of manufacturing the semiconductor device 401 will be discussed.

Figure 4:
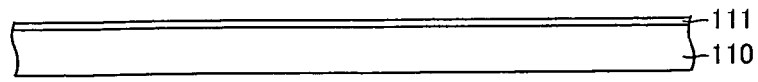
FIGS. 4(a).through 4(g) are cross sections illustrating manufacturing processes in accordance with yet another embodiment of the present invention.
Figure 4:
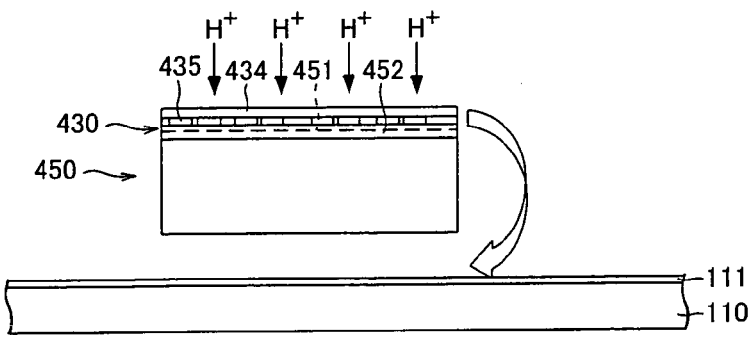
Figure 4:
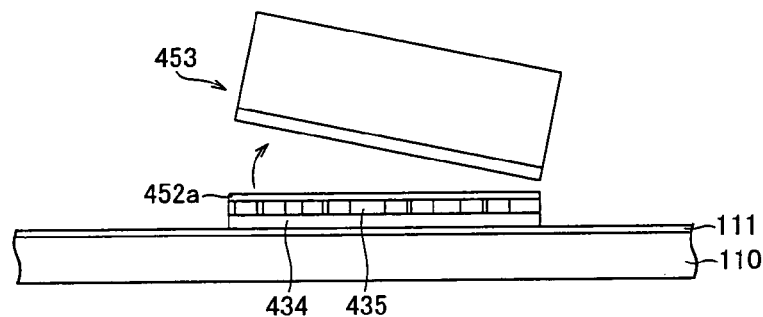
Figure 4:
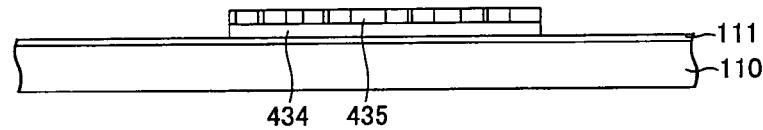
Figure 4:
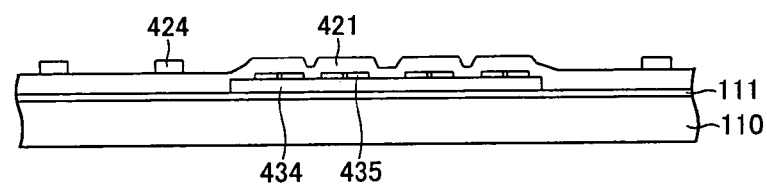
Figure 4:
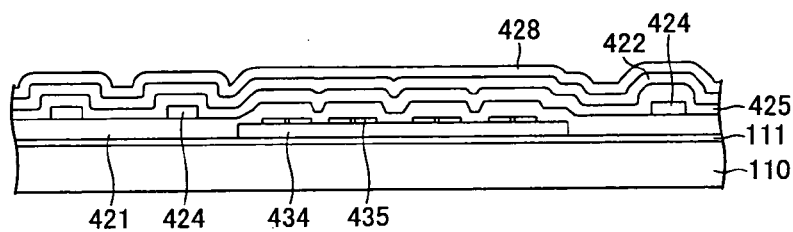
Figure 4:
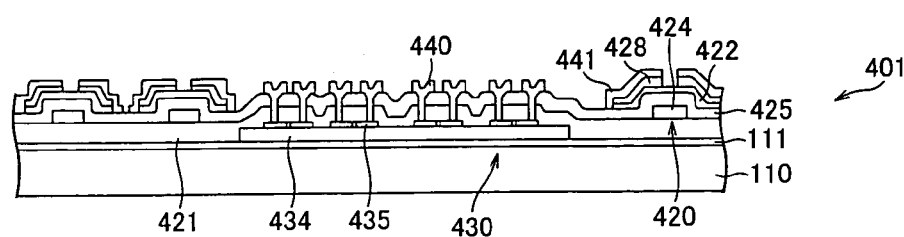

First, as shown in FIG. 4(a), the $SiO_2$ film 111 which is about 100 nm thick is formed so as to cover the entire surface of the insulating substrate 110 in the manner identical with Embodiment 1.

Then, as shown in FIG. 4(b), the SOI substrate (single-crystal silicon substrate) 450 on which the bipolar transistor 430 has independently been formed is formed, and bonded with the insulating substrate 110.

Referring to FIG. 4(b), how this SOI substrate 450 is formed is described.

First, in a typical IC manufacturing line, (i) the single-crystal silicon thin film 435 on which a junction part of the bipolar transistor 430 is formed, i.e. parts turning into a collector and emitter after impurity ion ($BF_2^+$, $P^{30}$) implantation are formed, and (ii) the $SiO_2$ film (interlayer insulating film) 434 are formed. Subsequently, hydrogen ions at a dose of $5\times10^{16}/cm^2$ are implanted in the BOX layer 452 so that the distribution of the hydrogen ions peaks in the BOX layer 452. Consequently, a hydrogen ion implantation section 451 is formed.

Next, the SOI substrate 450 having been formed as above is cut so as to have a predetermined size in conformity to a bonding region on the insulating substrate 110.

Then the insulating substrate 110 and the SOI substrate 450 are cleaned and activated by carrying out RCA (SC-1) clean. Furthermore, that surface of the SOI substrate 450 which is on the interlayer insulating film 434 side is aligned with the predetermined region on the insulating substrate 110, and the surface and the predetermined region are caused to closely contact each other so as to be bonded with each other at room temperatures.

Subsequently, as in FIG. 4(c), an unnecessary part 453 of the SOI substrate 450 bonded with the insulating substrate 110 is cleaved in the same manner as Embodiment 1.

As FIG. 4(d) shows, then an unnecessary part (BOX layer 452a) of the SOI substrate 450, which remains on the insulating substrate 110 after the cleavage, is wet-etched using diluted hydrofluoric acid, so that defects on the surface are removed.

Next, as shown in FIG. 4(e), the single-crystal silicon thin film 435 is etched so as to be island-shaped, and consequently, on the insulating substrate 110, a part of the bipolar TFT, in this case the single-crystal silicon thin film 435 which is about 20 nm thick is formed.

Then a second $SiO_2$ film (interlayer insulating film) 421 which is about 200 nm thick is deposited above the entire surface of the insulating substrate 110, by plasma CVD using a mixed gas of $SiH_4$ and $N_2O$. Further on the entire surface of the second $SiO_2$ film 421, a TaN thin film is deposited by sputtering and caused to have a predetermined pattern. As a result, wires for a gate layer including members such as the gate electrodes 424 and gate bus line are formed.

The wires of the gate layer are not necessarily made from the TaN thin film. That is, a material of the wires of the gate layer can be selected from various metal materials such as aluminum and aluminum alloy, in consideration of factors such as conformity with electrical resistance, heat resistance, and the processes after forming the wires.

Subsequently, as shown in FIG. 4(f), a silicon nitride film (gate insulating film) 425 which is about 200 nm is deposited as a gate insulating film, by plasma CVD using $SiH_4$ gas and $NH_3$ gas. Further on this silicon nitride film 425, the following films are successively deposited: the amorphous silicon thin film 422 which is about 50 nm thick is deposited by plasma CVD using an $SiH_4$ gas, and the $N^{30}$ amorphous silicon thin film 428, which is about 30 nm thick and p-doped by an $SiH_4$ gas and $PH_3$ mixed gas, is deposited by plasma CVD.

Then as shown in FIG. 4(g), the non-doped amorphous silicon thin film 422 and the p-doped $N^{30}$ amorphous silicon thin film 428 are etched so that an island-shaped part to be the transistor remains. Further on this part, as metal electrodes (metal film) 441 for a source bus line, a titan thin film is deposited by sputtering, and etched into a predetermined pattern.

Note that, the metal electrodes for the source bus line are not necessarily made of titan. That is, a material of the electrodes can be selected from various metal materials such as aluminum and aluminum alloy, in consideration of factors such as conformity with electrical resistance, heat resistance, and the processes after forming the wires.

Next, a predetermined region of the $N^{30}$ amorphous silicon thin film 428 formed on the island-shaped amorphous silicon thin film 422, i.e. a part to be a channel between the source and drain is removed by etching. It is noted that, on the occasion of etching and removing the region of the $N^{30}$ amorphous silicon thin film 428, a part of the non-doped amorphous silicon thin film 422 is also etched. As a result, the amorphous silicon thin-film transistor 420 is formed. subsequently, as a protective insulating film, a silicon nitride film which is about 200 nm thick is deposited by plasma CVD using an $SiH_4$ gas and an $NH_3$ gas (not illustrated).

When, for instance, the semiconductor device 401 is utilized as an active matrix substrate, members such as a resin interlayer film and transparent electrode for displaying are formed in the same manner as the case of using typical amorphous silicon. This process is well-known and thus the descriptions thereof are omitted here.

As described above, the semiconductor device 401 is arranged such that, in different regions on one insulating substrate, the amorphous thin-film silicon transistor (the non-single-crystal silicon thin-film transistor) 420 and the bipolar transistor (the single-crystal silicon thin-film transistor) 430 made from the single-crystal silicon thin film are provided. This arrangement is identical with that of the semiconductor device 101 of Embodiment 1. Thus, the semiconductor device 401 bring about effects similar to those of the semiconductor device 101 of Embodiment 1.

It is noted that, however, in the semiconductor device 401, a non-single-crystal silicon thin-film transistor is made up of the amorphous silicon thin-film transistor 420. On this account, the semiconductor device 401 has characteristics different from those of TFTs having other types of crystal structures such as single-crystal silicon, polycrystalline silicon, and continuous grain silicon. In other words, a mobility, threshold value, and S value of TFTs vary with crystal structures of a silicon thin film from which the TFTs are formed.

Thus, it is possible to select a suitably-structured silicon thin film for forming a TFT, in accordance with desired characteristics. For instance, to a non-single-crystal silicon region requiring high mobility, one can adopt a field effect transistor made from the continuous grain silicon.

The subsequent processes are identical with those of active matrix substrates using typical amorphous silicon. For instance, an active matrix substrate for liquid crystal display is completed after a resin interlayer film and transparent electrode for carrying out displaying are formed. These processes are well-known so that the descriptions thereof are omitted here.

Note that, in the manufacturing process of the semiconductor device 401, after bonding the SOI substrate including the single-crystal silicon thin film with the insulating substrate, the SOI substrate is cleaved and the cleaved surface is planarized. This process may be carried out in the same manner as Embodiment 2. That is to say, effects substantially identical with the above can be obtained when the double-layered silicon substrate in which the junction part of the bipolar transistor is formed on the porous silicon layer is bonded with the $SiO_2$ film 111 formed on the insulating substrate 110. When the double-layered silicon substrate is adopted in this manner, the mobility of the single-crystal silicon thin-film transistor is higher than the case of adopting the SOI substrate 450.

Note that, although in the present embodiment the insulating substrate 110 and the SOI substrate 450 are cleaned and activated by RCA (SC-1) clean, this is not the only method to clean and activate these substrates. For instance, hydrogen peroxide may be used instead of SC-1, and an oxygen plasma treatment may be carried out instead of RCA (SC-1) clean.

Embodiment 5

The following will discuss still another embodiment of a semiconductor device of the present invention and a method of manufacturing the same, with reference to figures. By the way, members having the same functions as those described in the semiconductor device 101 of Embodiment 1 are given the same numbers, so that the descriptions are omitted for the sake of convenience.

A semiconductor device 501 of the present embodiment is arranged in such a manner that a polycrystalline silicon thin-film transistor 120, two metal interconnects layers, and a semiconductor device 530 including a MOS single-crystal silicon thin-film transistor are integrated in different regions on an insulating substrate. The semiconductor device 501 is, for instance, utilized as an active matrix substrate.

Figure 12:
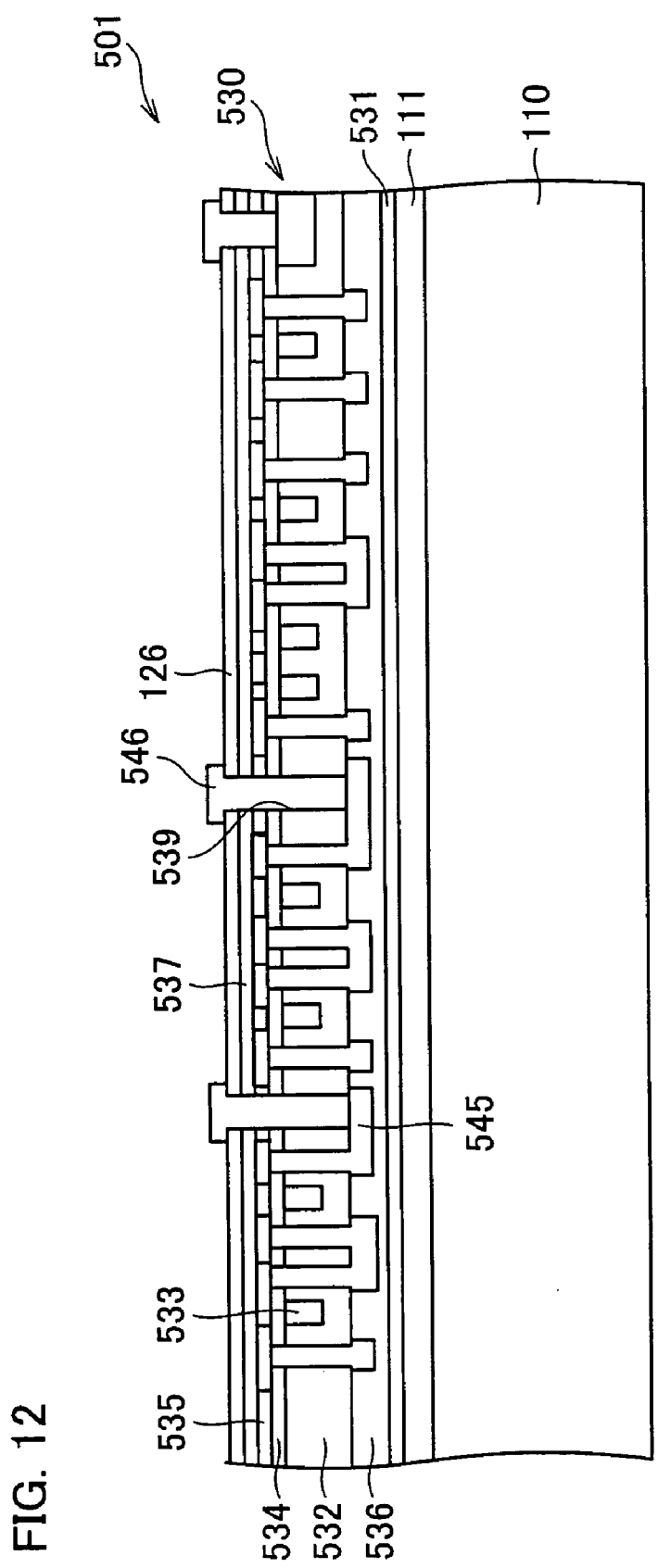
FIG. 12 is an enlarged view of FIG. 5(c).

As FIG. 12 shows, in the semiconductor device 501, two metal interconnects layers and a semiconductor device 530 including a single-crystal silicon thin-film transistor are formed on an $SiO_2$ film 111 formed on an insulating substrate 110. In the meantime, on the $SiO_2$ film 111, a polycrystalline silicon thin-film transistor 120 (not illustrated in FIG. 12) is formed in a region different from the region where the single-crystal silicon thin-film transistor is formed.

In the meantime, on the $SiO_2$ film 111, the semiconductor device 530 is formed in a region different from the region where the polycrystalline silicon thin-film transistor 120.

More specifically, on the $SiO_2$ film 111, an $SiO_2$ film 531 which is about 10 nm and a metal interconnects layer 536 including first metal interconnects 445 are formed.

Further on the metal interconnects layer 536, an interlayer insulating film 532 including first gate electrodes 533 is formed. On this interlayer insulating film 532, a gate insulating film 534 which is about 15 nm thick is formed, and further on this gate insulating film 534, a single-crystal silicon thin film 535 is formed.

Moreover, on the single-crystal silicon thin film 535, an $SiO_2$ film 537 which is about 60 nm thick is formed. On a part of the $SiO_2$ film 537, second gate electrodes (not illustrated) are formed. Further on the $SiO_2$ film 537 and the second gate electrodes, an interlayer insulating film 126 is formed. Note that, the interlayer insulating film 126 is formed above the entire surface of the insulating substrate 110 which has the single-crystal silicon thin film region and the non-single-crystal silicon thin film region.

On the interlayer insulating film 126, second metal interconnects 546 are formed. Some of these second metal interconnects 546 are connected to either the first metal interconnects or some of gate wires, via contact holes.

For liquid crystal display, above the polycrystalline silicon thin-film transistor 120 and semiconductor device 530, i.e. above the entire surface of the insulating substrate 110, a protective film, planarization film, and transparent conductive film for carrying out displaying are formed (not illustrated).

Now, a method of manufacturing the semiconductor device 501 is discussed.

First, on the insulating substrate 110, the $SiO_2$ film 111 which is about 100 nm is formed in the same manner as in Embodiment 1.

Figure 5:
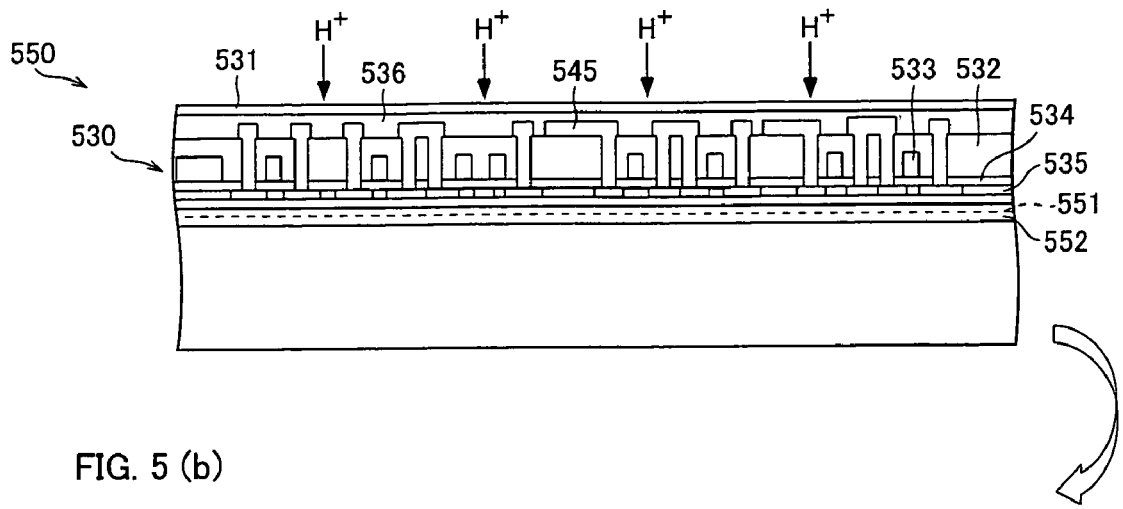
FIGS. 5(a) through 5(c) are cross sections illustrating manufacturing processes in accordance with still another embodiment of the present invention.
Figure 5:
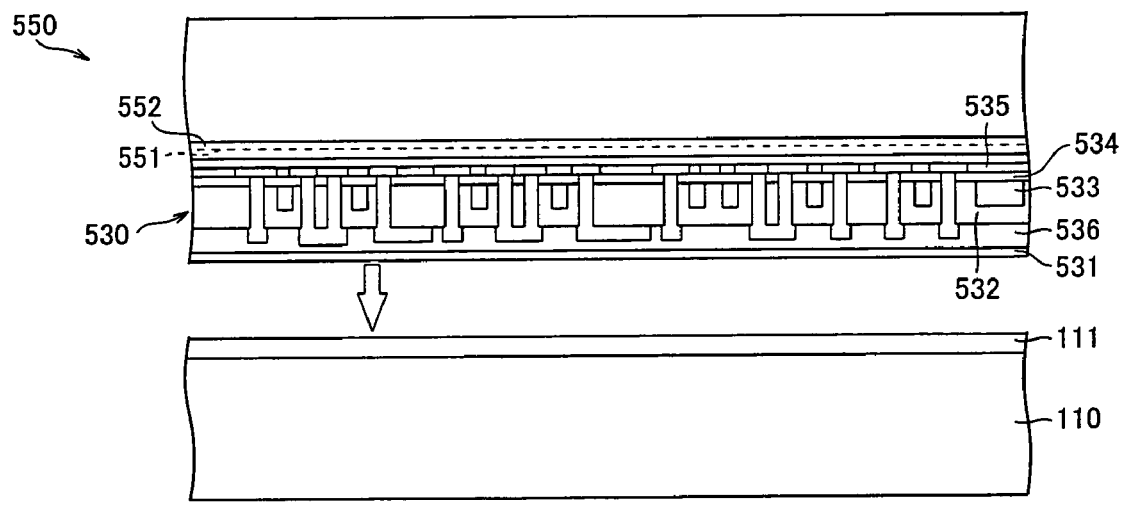
Figure 5:
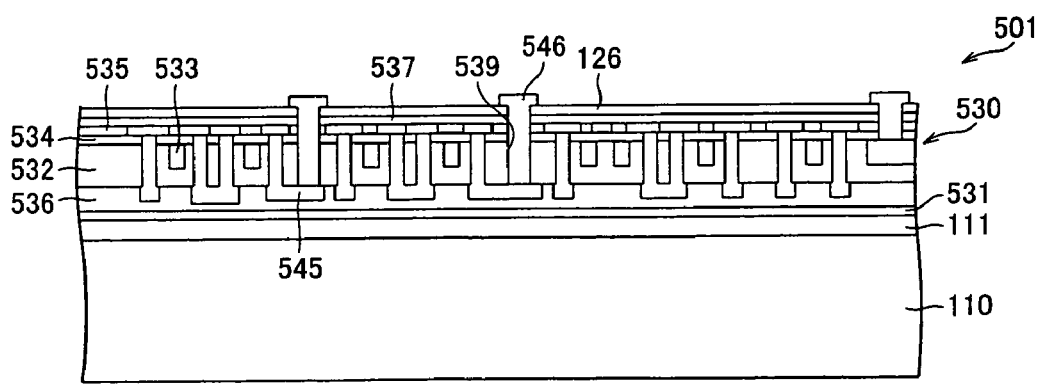

As FIG. 5(a) shows, then the SOI substrate (single-crystal silicon substrate) 550 on which the semiconductor device 530 has independently been formed is formed, and this SOI substrate 550 is bonded with the insulating substrate 110 as in FIG. 5(b).

A method of manufacturing this SOI substrate 550 is described with reference to FIG. 5(a). First, in a typical IC manufacturing line, a part of a CMOS process is carried on a BOX layer 552, more specifically, a single-crystal silicon thin film 535 to which source and drain impurity ions ($BF_2^+$, $P^{30}$) are implanted and channel doped by ion implantation in P and N channel regions, gate insulating film 534, first gate electrodes 533, interlayer insulating film 532, protective insulating film (not illustrated), first metal interconnects layer 536 including the first metal interconnects 545, and $SiO_2$ film 531 are formed on the BOX layer 552. Subsequently, hydrogen ions are implanted in the BOX layer 552 at a dose of $5×10^{16}/cm^2$ so that the distribution of the hydrogen ions peaks in the BOX layer 552. With this, a hydrogen ion implantation section 551 is formed.

In this case, although the first gate electrodes 533 in this case are made of heavily-doped polycrystalline silicon film and W silicide, the first gate electrodes 533 may be made sorely of polycrystalline silicon or made of other high melting point metals and silicide. The material of the gate electrodes 533 is determined in consideration of electric resistance and heat resistance.

The first metal interconnects 545 in this case is made of Ti—W. However, the first metal interconnects 545 may be made of a typical material for making wires, such as Al—Si and Al—Cu alloy.

Next, the SOI substrate 550 having been formed as above is cut so as to have a predetermined size in conformity to a bonding region on the insulating substrate 110.

Subsequently, in the same manner as in Embodiment 1, the SOI substrate 550 is bonded with the insulating substrate 110, and then an unnecessary part of the SOI substrate 550 is, by carrying out heat treatment, cleaved at the hydrogen ion implantation section 551. Furthermore, a remaining BOX layer on the silicon layer on the insulating substrate 110 is removed by etching the same.

Then on the single-crystal silicon thin film 535, the $SiO_2$ film 537 and second gate electrodes (not illustrated) are formed. Then in the same manner as in Embodiment 1, a polycrystalline silicon thin-film transistor is formed and the interlayer insulating film 126 is formed above the entire surface of the insulating substrate 110.

Further on the interlayer insulating film 126 in the single-crystal silicon thin film region, the second metal interconnects 546 are formed. Also, some of the second metal interconnects are connected to either first metal interconnects or some of first gate electrodes, via the contact holes 539.

In subsequent processes, above the entire surface of the insulating substrate 110, a protective film, planarization film, and transparent conductive film for carrying out displaying are formed in a typical manner, for the sake of liquid crystal display.

As described above, the semiconductor device 501 is arranged such that, in different regions on one insulating substrate, the polycrystalline silicon thin-film transistor 120 and the semiconductor device 530 are formed. This arrangement is identical with that of the semiconductor device 101 of Embodiment 1. Thus, the semiconductor device 501 bring about effects similar to those of the semiconductor device 101 of Embodiment 1.

The semiconductor device 501 includes the semiconductor device 530 (the single-crystal silicon thin-film device) and two metal interconnects layers. With this, the single-crystal silicon thin-film device can be designed in various ways, in accordance with required characteristics.

It is noted that, in the semiconductor device 501, the first metal interconnects are made of Ti—W alloy. This makes it possible to carry out the heat treatment in the process of separating the single-crystal silicon thin film, without using barrier metal.

That is to say, since the heat treatment is carried out at temperatures not more than 600° C., typical materials for making wires, such as Al—Si and Al—Cu, can be adopted with no danger of exceeding the melting point. It is noted that, however, since aluminum materials react chemically with silicon and cause contact failure, barrier metal is necessary when adopting the aluminum materials.

When adopting aluminum alloy for making fine wires, it is necessary to give consideration to an influence of hillock. For this reason, other types of high melting point metals may be preferable in consideration of electric resistance of wires.

The semiconductor device 501 may be formed using the double-layered silicon substrate in Embodiment 2, instead of the SOI substrate 550. When the double-layered silicon substrate is adopted, the single-crystal silicon thin-film transistor formed on the insulating substrate has a mobility higher than the mobility of the single-crystal silicon thin-film transistor formed using the SOI substrate 550.

As shown in FIG. 7, furthermore, the semiconductor devices described in respective Embodiments 1-5 can be integrated, as a drive circuit 710, on an active matrix substrate 700 including a display section 720.

The invention being thus described, it will be obvious that the same way may be varied in many ways, and all such modifications as would be obvious to one skilled in the art are intended to be included within the scope of the following claims. Unmentioned embodiments fabricated by combining technical means described in different Embodiments 1-5 are not to be regarded as a departure from the spirit and scope of the invention.

Since the embodiments of the present invention are not restricted to the above, the way of forming non-crystal silicon, the materials of interlayer insulating films, and the thicknesses of the films may be realized using various means which are obvious to one skilled in the art. Furthermore, materials other than the above-described materials may be adopted to realize similar effects, given that the materials are typically used for achieving the same objects as those of the above-described materials.

Furthermore, the semiconductor devices formed from either single-crystal silicon or non-single-crystal silicon are not limited to a MOS transistor, bipolar transistor, SIT, and diode it would rather be an advantage of the present invention that any types of semiconductor devices can be integrated on one glass substrate. This advantage is useful for, for instance, a high-performance multifunction system LSI and a high-performance LSI enhanced by SOI.

To solve the above-identified problem, the semiconductor device of the present invention, comprises: an insulating substrate having a surface on which an $SiO_2$ film is formed; and a single-crystal silicon substrate bonded with the insulating substrate, and is arranged in such a manner that, after bonding a surface of the single-crystal silicon substrate including a single-crystal silicon thin film, on the surface of the single-crystal silicon substrate an $SiO_2$ film is formed, with the surface of the insulating substrate, where the $SiO_2$ film is formed, a part of the single-crystal silicon substrate is separated, and then a part of a remaining part of the single-crystal silicon substrate, the remaining part still being on the insulating substrate after the part is separated, is removed.

Furthermore, to solve the above-identified problem, the method of manufacturing the semiconductor device of the present invention, in which a single-crystal silicon substrate is bonded with an insulating substrate having a surface on which an $SiO_2$ film is formed, comprises the steps of: (i) bonding a surface of the single-crystal silicon substrate including a single-crystal silicon thin film, on the surface of the single-crystal substrate an $SiO_2$ film is formed, with the surface of the insulating substrate, where the $SiO_2$ film is formed; (ii) after the step (i), separating a part of the single-crystal silicon substrate; and (iii) removing a part of a remaining part of the single-crystal silicon substrate, the remaining part still being on the insulating substrate after the step (ii).

For instance, the semiconductor device of the present invention may comprise: an insulating substrate having a surface on which an $SiO_2$ film is formed; and a single-crystal silicon substrate bonded with the insulating substrate, and be arranged in such a manner that, the single-crystal silicon substrate includes a BOX layer, a hydrogen ion implantation section in which distribution of hydrogen ions peaks in the BOX layer, and a single-crystal silicon thin film formed on the BOX layer, the surface of the insulating substrate, where the $SiO_2$ film is formed, is bonded with a surface of the single-crystal silicon substrate, the surface of the single-crystal silicon substrate being on a single-crystal silicon thin film side with respect to the BOX layer and having an $SiO_2$ film formed thereon, and a part of the single-crystal silicon substrate is separated at the hydrogen ion implantation section, and the BOX layer is removed from a remaining part of the single-crystal silicon substrate, the remaining part still being on the insulating substrate after the part is separated.

The method of manufacturing the semiconductor device of the present invention, in which a single-crystal silicon substrate is bonded with an insulating substrate, may comprise the steps of: (I) bonding a surface of the insulating substrate, on the surface an $SiO_2$ film being formed, with a surface of the single-crystal silicon substrate including a BOX layer, a hydrogen ion implantation section in which distribution of hydrogen ions peaks in the BOX layer, and the single-crystal silicon thin film formed on the BOX layer, the surface of the single-crystal silicon substrate being on a single-crystal silicon thin film side with respect to the BOX layer and having an $SiO_2$ film formed thereon; (II) after the step (I), separating a part of the single-crystal silicon substrate at the hydrogen ion implantation section; and (III) removing the BOX layer from a remaining part of the single-crystal silicon substrate, the remaining part still being on the insulating substrate after the step (II).

With the above-mentioned semiconductor device and the method of manufacturing the same, before bonding the single-crystal silicon substrate with the insulating substrate, the BOX layer, the hydrogen ion implantation section in which distribution of hydrogen ions peaks in the BOX layer, and the single-crystal silicon thin film formed on the BOX layer are formed on the single-crystal silicon substrate. This makes it possible to easily reduce the thickness of the single-crystal silicon thin film.

Furthermore, since the separation at the hydrogen ion implantation section formed in the BOX layer of the single-crystal silicon substrate is carried out after bonding the insulating substrate with the single-crystal silicon substrate, a damaged layer on the separation surface, which has a dangling bond and crystal defect, is confined only in the BOX layer.

Thus, after the separation, the BOX layer on the separation surface is removed from that part of the single-crystal silicon substrate which still remains on the insulating substrate, so that the single-crystal silicon thin film with no surface damages can be formed on the insulating substrate, without deteriorating uniformity of the thickness of the film. With this, it is, for instance, possible to restrain the variation of a threshold voltage of a MOS SOI transistor.

Thus, the arrangement above realizes a single-crystal silicon thin film which is thin, has no surface damages, and uniform in thickness, and by which a single-crystal silicon thin-film device can be easily formed without using an adhesive.

Note that, the single-crystal silicon thin-film device is a device formed from a single-crystal silicon thin film, such as a MOS transistor, bipolar transistor, SIT, and diode.

The semiconductor device of the present invention may comprise: an insulating substrate having a surface on which an $SiO_2$ film is formed; and a single-crystal silicon substrate bonded with the insulating substrate, and be arranged in such a manner that, the single-crystal silicon substrate includes a porous silicon layer and a single-crystal silicon thin film formed on the porous silicon layer and has a surface which is on a single-crystal silicon thin film side with respect to a porous silicon layer and on which an $SiO_2$ film is formed, the surface of the insulating substrate, where the $SiO_2$ film is formed, is bonded with the surface of the single-crystal silicon substrate, where the $SiO_2$ film is formed, and a part of the single-crystal silicon substrate is separated at the porous silicon layer, and the porous silicon layer is removed from a remaining part of the single-crystal silicon substrate, the remaining part still being on the insulating substrate after the part is separated.

The method of manufacturing the semiconductor device of the present invention, in which a single-crystal silicon substrate is bonded with an insulating substrate, may comprise the steps of: (i) bonding the surface of the insulating substrate, where the $SiO_2$ film is formed, with a surface of the single-crystal silicon substrate including a single-crystal silicon thin film formed on a porous silicon layer, the surface of the single-crystal silicon substrate being on a single-crystal silicon thin film side with respect to the porous silicon layer and having an $SiO_2$ film formed thereon; (ii) after the step (i), separating a part of the single-crystal silicon substrate at the porous silicon layer; and (iii) removing the porous silicon layer from a remaining part of the single-crystal silicon substrate, the remaining part still being on the insulating substrate after the step (ii).

According to the above-described semiconductor device and the method of manufacturing the same, the porous silicon layer and the single-crystal silicon thin film on the porous silicon layer are formed before bonding the single-crystal silicon substrate with the insulating substrate. This makes it possible to easily reduce the thickness of the single-crystal silicon thin film.

Furthermore, since the separation at the porous silicon layer of the single-crystal silicon substrate is carried out after bonding the insulating substrate with the single-crystal silicon substrate, and no hydrogen ion is implanted, a damaged layer on the separation surface, which has a dangling bond and crystal defect, is confined only in the porous silicon layer.

Thus, after the separation, the porous silicon layer on the separation surface is removed from that part of the single-crystal silicon substrate which still remains on the insulating substrate, so that the single-crystal silicon thin film with no surface damages can be formed on the insulating substrate, without deteriorating uniformity of the thickness of the film.

Thus, the arrangement above realizes a single-crystal silicon thin film which is thin, has no surface damages, and uniform in thickness, and by which a single-crystal silicon thin-film device can be easily formed without using an adhesive.

Furthermore, according to the arrangement above, the number of defects in single-crystal silicon is very small. On this account, the mobility of the single-crystal silicon thin-film transistor formed using the porous silicon layer is higher than the mobility of the single-crystal silicon thin-film transistor formed using the single-crystal silicon substrate with the hydrogen ion implantation section.

Further, the method of manufacturing the semiconductor of the present invention is preferably arranged such that the step of bonding the single-crystal silicon substrate with the insulating substrate is carried out in a vacuum. With this, bonding errors can be restrained.

Further, the method of manufacturing the semiconductor of the present invention is preferably arranged such that heat treatment is carried out after the step of bonding the single-crystal silicon substrate with the insulating substrate.

With this, the bonding strength between the single-crystal silicon substrate and the insulating substrate can be improved.

Further, the method of manufacturing the semiconductor device of the present invention is preferably arranged such that the single-crystal silicon substrate and the insulating substrate are cleaned and activated before the step of bonding the single-crystal silicon substrate with the insulating substrate.

According to this arrangement, the surfaces of the single-crystal silicon substrate and the insulating substrate are activated so that these substrates can be adhered with each other without using an adhesive, by causing these substrates to closely contact with each other.

Note that, the cleaning and activation may be carried out by RCA (SC-1) clean. With this, the substrates can be easily cleaned and activated.

The semiconductor device of the present invention may be arranged such that, in different regions on the insulating substrate, a single-crystal silicon thin film and a non-single-crystal silicon thin film are formed.

That is, the single-crystal silicon substrate is bonded with the insulating substrate, and then separated at either the hydrogen ion implantation section or the porous silicon layer, so that the single-crystal silicon thin film is formed in a region on the insulating substrate, while the non-single-crystal silicon thin film is formed on a different region on the insulating substrate.

With this, it is possible to form devices having different characteristics in different regions on the insulating substrate, in accordance with required characteristics.

The semiconductor device of the present invention can be arranged such that, above the substantially entire surface of the insulating substrate, the single-crystal silicon thin film is formed.

That is, the single-crystal silicon substrate is bonded with the insulating substrate, and then separated at either the hydrogen ion implantation section or the porous silicon layer. As a result, the single-crystal silicon thin film is formed above the substantially entire surface of the insulating substrate.

With this, it is possible to form, above the substantially entire surface of the insulating substrate, the single-crystal silicon thin-film device which is thin, has no surface damages, and is uniform in thickness.

Furthermore, the semiconductor device of the present invention may be arranged such that, the single-crystal silicon substrate is bonded with the insulating substrate, and then separated at either the hydrogen ion implantation section or the porous silicon layer, so that the single-crystal silicon thin film which is about not more than 70 nm thick, preferably about not more than 20 nm thick is formed on the insulating substrate.

With this, it is possible to restrain a short channel effect that is intensified as the miniaturization of the transistor advances.

The semiconductor device of the present invention may be arranged such that the non-single-crystal silicon thin film is composed of any one of the polycrystalline silicon, continuous grain silicon, and amorphous silicon.

Non-single-crystal silicon thin-film devices composed of the polycrystalline silicon, continuous grain silicon, and amorphous silicon typically have different characteristics. For instance, the mobility of a field effect transistor made from the continuous grain silicon is higher than that of a field effect transistor made from the polycrystalline silicon.

Thus, it is possible to form a non-single-crystal silicon thin-film device in which respective regions have different characteristics, by, for instance, adopting a field effect transistor made from the continuous grain silicon to a non-single-crystal silicon region requiring a high mobility.

The semiconductor device of the present invention may be arranged such that, a non-single crystal silicon thin-film transistor, which includes a gate insulating film made up of at least one insulating film including silicon nitride, is formed using the amorphous silicon thin film.

With this, the dielectric permittivity is substantially doubled comparing to a case that the gate insulating film is made of $SiO_2$, and hence a higher field effect can be obtained with a lower voltage, and the driving voltage of the transistor can be lowered. Also, the characteristics of an amorphous silicon TFT decrease when the gate insulating film is made of $SiO_2$. Adopting the gate insulating film made of silicon nitride restrains this decrease of the characteristics.

Furthermore, in the semiconductor device of the present invention, the transistor formed using the single-crystal silicon thin film may be arranged such that, from an insulating substrate side, gate electrodes, a gate insulating film, and the single-crystal silicon thin film are formed in this order.

With this, the back gate effect caused by a fixed charge located on the surface of the glass substrate is shielded by the gate electrodes so that the variation of the threshold value is reduced, the process of connecting the single-crystal silicon thin film with the metal interconnects is facilitated, and thus the productivity is improved.

Furthermore, the semiconductor device of the present invention may be arranged such that, at least a part of the transistor formed using the single-crystal silicon thin film includes an interlayer insulating film and metal interconnects provided further on the single-crystal silicon thin film.

With this, it is possible to form various types of single-crystal silicon thin-film devices, in consideration of required characteristics.

In the semiconductor device of the present invention, the transistor formed using the single-crystal silicon thin film may be arranged such that, from an insulating substrate side, an interlayer insulating film, a metal interconnects layer, an interlayer insulating film, a gate electrode, a gate insulating film, and the single-crystal silicon thin film are formed in this order, and in at least a part of the transistor, an interlayer insulating film and metal interconnects are further provided.

With this, it is possible to form various types of single-crystal silicon thin-film devices, in consideration of required characteristics.

The semiconductor device of the present invention is preferably arranged such that, a difference of linear expansion between the insulating substrate and the single-crystal silicon substrate is about not more than 250 ppm at temperatures in a range between substantially room temperatures and 600° C.

With this, the shear strength between the insulating substrate and the single-crystal silicon substrate, which is caused by the difference of the linear expansion, is reduced.

On this account, it is possible to, for instance, the crack and warpage of the substrates on the occasion of the heat treatment for the cleavage is restrained, and consequently the success rate of the cleavage is increased. Furthermore, the bonding strength between the insulating substrate and the single-crystal silicon substrate can be increased, and the crack and warpage of the substrates caused by the difference of the linear expansion is prevented on the occasion of carrying out heat treatment for forming an oxidized film on the insulating substrate or the single-crystal silicon substrate.

The semiconductor device of the present invention is preferably arranged such that, the insulating substrate is composed of a high strain point glass whose strain point is not less than 500° C.

This makes it possible to carry out heat treatment in the manufacturing process, thereby improving the productivity. Carrying out heat treatment also improves the bonding strength between the insulating substrate and the single-crystal silicon substrate.

The semiconductor device of the present invention is preferably arranged such that, the insulating substrate is an alkaline-earth alumino-borosilicate glass.

The semiconductor device of the present invention is preferably arranged such that, the insulating substrate is composed of any one of a barium borosilicate glass, a barium alumino-borosilicate glass, an alkaline-earth alumino-borosilicate glass, a borosilicate glass, an alkaline-earth-zinc-lead-alumino-borosilicate glass, and an alkaline-earth-lead-alumino-borosilicate glass.

With this, the material of the insulating substrate can be selected from a wide variety of materials, in consideration of reasons such as the costs and workability.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A semiconductor device, comprising:
   an insulating substrate having a surface on which a first $SiO_2$ film is formed;
   a single-crystal silicon thin film having bonded thereto a second $SiO_2$ film, which single-crystal silicon thin film is bonded with the insulating substrate on a partial region of the insulating substrate via the first and second $SiO_2$ films; and
   a non-single-crystal silicon thin film comprising an active area of a transistor and formed on the insulating substrate in a region where the single-crystal silicon thin film is not bonded with the insulating substrate, which non-single-crystal silicon thin film is formed on the insulating substrate via the first $SiO_2$ film and a third $SiO_2$ film,
   wherein the second $SiO_2$ film and the third $SiO_2$ film are of different thicknesses.

2. The semiconductor device as defined in claim 1, wherein the single-crystal silicon thin film has a thickness of not more than about 70 nm.

3. The semiconductor device as defined in claim 1, wherein the single-crystal silicon thin film has a thickness of not more than about 20 nm.

4. The semiconductor device as defined in claim 1, wherein the non-single-crystal silicon thin film comprises polycrystalline silicon.

5. The semiconductor device as defined in claim 1, wherein the non-single-crystal silicon thin film comprises continuous grain silicon.

6. The semiconductor device as defined in claim 1, wherein the non-single-crystal silicon thin film comprises amorphous silicon.

7. The semiconductor device as defined in claim 6, wherein a non-single crystal silicon thin-film transistor, which includes a gate insulating film made up of at least one insulating film including silicon nitride, is formed using the amorphous silicon thin film.

8. The semiconductor device as defined in claim 1, wherein the insulating substrate comprises a high strain point glass including an alkaline-earth alumino-borosilicate glass.

9. The semiconductor device as defined in claim 1, wherein the insulating substrate comprises any one of a barium borosilicate glass, a barium alumino-borosilicate glass, an alkaline-earth alumino-borosilicate glass, a borosilicate glass, an alkaline-earth-zinc-lead-alumino-borosilicate glass, and an alkaline-earth-lead-alumino-borosilicate glass.

10. The semiconductor device as defined in claim 1, wherein a difference of linear expansion between the insulating substrate and the single-crystal silicon thin film is about not more than 250 ppm at temperatures in a range between substantially room temperature and 600° C.

11. The semiconductor device as defined in claim 1, wherein the insulating substrate comprises a high strain point glass whose strain point is not less than 500° C.

12. The semiconductor device as claimed in claim 1, wherein the non-single-crystal silicon thin film is not formed on the insulating substrate via the second $SiO_2$ film.

13. The semiconductor device as claimed in claim 1, wherein the second $SiO_2$ film is provided in an area corresponding to an area of the single-crystal silicon thin film.

14. A semiconductor device, comprising:
    an insulating substrate having a surface on which a first $SiO_2$ film is formed;
    a single-crystal silicon thin film having bonded thereto a second $SiO_2$ film, which single-crystal silicon thin film is bonded with the insulating substrate on a partial region of the insulating substrate via the first and second $SiO_2$ films; and
    a non-single-crystal silicon thin film formed on the insulating substrate in a region where the single-crystal silicon thin film is not bonded with the insulating substrate, which non-single-crystal silicon thin film is formed on the insulating substrate via the first $SiO_2$ film and a third $SiO_2$ film,
    wherein the second $SiO_2$ film and the third $SiO_2$ film are of different thicknesses, and
    wherein a transistor formed using the single-crystal silicon thin film is arranged such that, from an insulating substrate side, a gate electrode, a gate insulating film, and the single-crystal silicon thin film are formed in this order.

15. The semiconductor device as defined in claim 14, wherein at least a part of the transistor formed using the single-crystal silicon thin film includes an interlayer insulating film and metal interconnects provided further on the single-crystal silicon thin film.

16. The semiconductor device as defined in claim 14, wherein the transistor formed using the single-crystal silicon thin film is arranged such that, from an insulating substrate side, an interlayer insulating film, a metal interconnects layer, an interlayer insulating film, a gate electrode, a gate insulating film, and the single-crystal silicon thin film are formed in this order, and in at least a part of the transistor, an interlayer insulating film and metal interconnects are further provided on the single-crystal silicon thin film.

17. A semiconductor device, comprising:
    an insulating substrate having a surface on which a first $SiO_2$ film is formed;
    a single-crystal silicon thin film having bonded thereto a second $SiO_2$ film, which single-crystal silicon thin film is bonded to the insulating substrate via the first and second $SiO_2$ films, the single-crystal silicon thin film having a substantially uniform thickness and a substantially damage-free surface; and
    a non-single-crystal silicon thin film comprising an active area of a transistor and formed on the insulating substrate in a region where the single-crystal silicon thin film is not bonded with the insulating substrate, which non-single-crystal silicon thin film is formed on the insulating substrate via the first $SiO_2$ film and a third $SiO_2$ film, wherein the second $SiO_2$ film and the third $SiO_2$ film are of different thicknesses.

18. The semiconductor device as defined in claim 17, further comprising:

transistor elements formed from the single-crystal silicon thin film.

19. The semiconductor device as claimed in claim 17, wherein the non-single-crystal silicon thin film is not formed on the insulating substrate via the second $SiO_2$ film.

20. The semiconductor device as claimed in claim 17, wherein the second $SiO_2$ film is provided in an area corresponding to an area of the single-crystal silicon thin film.

21. A semiconductor device, comprising:

an insulating substrate having a surface on which a first $SiO_2$ film is formed;

a single-crystal silicon thin film having bonded thereto a second $SiO_2$ film, which single-crystal silicon thin film is bonded to the insulating substrate via the first and second $SiO_2$ films, the single-crystal silicon thin film having a substantially uniform thickness and a substantially damage-free surface;

a non-single-crystal silicon thin film formed on the insulating substrate in a region where the single-crystal silicon thin film is not bonded with the insulating substrate, which non-single-crystal silicon thin film is formed on the insulating substrate via the first $SiO_2$ film and a third $SiO_2$ film; and transistor elements formed from the single-crystal silicon thin film, wherein the second $SiO_2$ film and the third $SiO_2$ film are of different thicknesses, and wherein the transistor elements are arranged such that, from an insulating substrate side, a gate electrode, a gate insulating film, and the single-crystal silicon thin film are formed in this order.

22. A semiconductor device, comprising:

an insulating substrate having a surface on which a first $SiO_2$ film is formed; and a single-crystal silicon thin film bonded with the insulating substrate on a partial region of the insulating substrate, wherein the single-crystal silicon thin film has a substantially uniform thickness and has a surface substantially free of damage, the single-crystal silicon thin film has bonded thereto a second $SiO_2$ film, the surface of the insulating substrate, where the first $SiO_2$ film is formed, is bonded with the single-crystal silicon thin film, where the second $SiO_2$ film is formed, and a transistor formed using the single-crystal silicon thin film is arranged such that, from an insulating substrate side, a gate electrode, a gate insulating film, and the single-crystal silicon thin film are formed in this order.

23. A semiconductor device, comprising:

an insulating substrate having a surface on which a first $SiO_2$ film is formed;

a single-crystal silicon thin film bonded to the insulating substrate, the single-crystal silicon thin film having a substantially uniform thickness and a substantially damage-free surface; and transistor elements formed from the single-crystal silicon thin film, wherein the single-crystal silicon thin film has bonded thereto a second $SiO_2$ film, the surface of the insulating substrate on which the first $SiO_2$ film is formed is bonded with the second $SiO_2$ film thereby bonding the single-crystal silicon thin film to the insulating substrate, the bonded single-crystal silicon thin film is disposed on only part of the insulating substrate on which the first $SiO_2$ film is formed, and the transistor elements are arranged such that, from an insulating substrate side, a gate electrode, a gate insulating film, and the single-crystal silicon thin film are formed in this order.

* * * * *